(12) United States Patent
Ohtani

(10) Patent No.: US 7,576,485 B2
(45) Date of Patent: Aug. 18, 2009

(54) IMAGE DISPLAY DEVICE WITH NARROW FRAME

(75) Inventor: Hisashi Ohtani, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 491 days.

(21) Appl. No.: 10/988,265

(22) Filed: Nov. 12, 2004

(65) Prior Publication Data

US 2005/0127818 A1    Jun. 16, 2005

(30) Foreign Application Priority Data

Nov. 21, 2003   (JP)   ............................. 2003-391815

(51) Int. Cl.
*H01J 1/62*   (2006.01)
*H01J 5/50*   (2006.01)

(52) U.S. Cl. .............................. 313/505; 313/51; 313/49

(58) Field of Classification Search ................. 313/505, 313/506, 509, 512, 49, 51, 583; 257/91, 257/93, 99; 361/777, 778; 315/169.1, 169.3
See application file for complete search history.

(56) References Cited

U.S. PATENT DOCUMENTS

| | | | |
|---|---|---|---|
| 6,175,345 B1 * | 1/2001 | Kuribayashi et al. ........... 345/76 |
| 6,593,691 B2 | 7/2003 | Nishi et al. |
| 6,608,449 B2 | 8/2003 | Fukunaga ................ 315/169.3 |
| 6,665,037 B2 | 12/2003 | Hagiwara |
| 6,724,456 B2 | 4/2004 | Kamiya |
| 6,989,571 B2 | 1/2006 | Park et al. |
| 7,034,452 B2 | 4/2006 | Kim |
| 7,067,976 B2 * | 6/2006 | Yamazaki .................... 313/512 |
| 7,221,094 B2 * | 5/2007 | Heo et al. .................... 313/509 |
| 7,221,340 B2 | 5/2007 | Matsuda et al. |
| 7,271,411 B2 | 9/2007 | Koyama et al. |
| 2003/0076048 A1 * | 4/2003 | Rutherford ............... 315/169.3 |
| 2003/0197475 A1 | 10/2003 | Takamura et al. |
| 2004/0003939 A1 | 1/2004 | Nishi et al. |
| 2005/0045891 A1 | 3/2005 | Yamazaki et al. |
| 2006/0286889 A1 | 12/2006 | Nishi et al. |

FOREIGN PATENT DOCUMENTS

| | | |
|---|---|---|
| CN | 1300105 A | 6/2001 |
| JP | 10-198285 | 7/1998 |
| JP | 11-288001 | 10/1999 |

OTHER PUBLICATIONS

Office Action, Chinese Application No. 200410095663.2, dated Apr. 18, 2008 with English translation.
Office Action re Chinese application No. CN 200410095663.2, dated Feb. 27, 2009 (with English translation).

* cited by examiner

*Primary Examiner*—Sikha Roy
*Assistant Examiner*—Anne M Hines
(74) *Attorney, Agent, or Firm*—Cook Alex Ltd.

(57) ABSTRACT

The invention provides a display device having a structure for preventing a voltage drop of anode lines or cathode lines as well as realizing a narrow frame. According to the invention, a narrow frame can be realized and a voltage drop of a lead wiring can be suppressed by substituting a lead wiring which conventionally occupied a large area in a frame region by an external wiring such as an FPC, a sealing can, and a conductive film formed on a counter substrate.

30 Claims, 15 Drawing Sheets

IMAGE DISPLAY DEVICE WITH NARROW FRAME

BACKGROUND OF THE INVENTION

1. Field of the Invention

The present invention relates to a display device, in particular to a display device formed of a thin film semiconductor element.

2. Description of the Related Art

A thin display device which is called an FPD (Flat Panel Display) is becoming more widely used as a display for a portable electronic apparatus such as a mobile device. In particular, a display using an electroluminescent element which emits light when a current flows into a layer including an organic material is promoted for practical use since it has many advantages such as a self-light emission, low power consumption, and fast response.

A display of electronic apparatus which is designed for portable use is required to have various characteristics such as low power consumption, lightweight, thinness, compactness, and a narrow frame. To realize a narrow frame means to increase a ratio occupied by a display portion in the whole display area. With a narrow frame, a display can be more compact without changing the area of a display portion and an area of display portion can be increased without changing the size of the display.

With a narrow frame as described above, a mobile device which is easier to carry, more elegant and stylish can be fabricated without changing the area of a display portion. Moreover, provided that the areas of the display and the display portion are not changed in the design that realized a narrow frame, circuits having various functions can be provided in the frame portion that is left, thus a product with higher additional value can be provided. Accordingly, a preferable product which meets users' demands can be provided. In view of the aforementioned reasons, a development for realizing a narrower frame of display is carried out from various perspectives. (see Patent Document 1)

[Patent Document 1]
   Japanese Patent Laid-Open No. Hei 11-288001

SUMMARY OF THE INVENTION

These and other objects, features and advantages of the present invention will become more apparent upon reading of the following detailed description along with the accompanied drawings.

In this manner, various methods are taken to achieve a narrow frame. In a display device using an electroluminescent element, what occupies the frame area the most is a lead wiring.

A plurality of anode lines or a plurality of cathode lines are laid out in stripe shape in a pixel portion, to which a constant voltage is supplied. In order to obtain an even display on the entire panel, all of the anode lines or the cathode lines is required to hold the same voltage. In the case where a voltage is supplied to ends of the anode lines or the cathode lines, a voltage drop occurs because pixels connected to them consume current, thus the other ends have a lower voltage than the supplied voltage. This voltage drop being too large, a display could also be affected. Therefore, a voltage is often supplied to both ends of the anode lines and the cathode lines. Note that the wirings connected to the anode side or the cathode side of the electrode in OLED (Organic Light Emitting Diode) and provide the current for the light emitting is referred to as the anode lines or the cathode lines in this specification.

Then, a voltage is supplied from a power source circuit outside or inside the panel. A voltage supplied from outside the panel is supplied to both ends of the anode lines or the cathode lines from an external connecting portion through wirings. The wirings which lead the voltage from the external connecting portion to the both ends of the anode lines or the cathode lines are referred to as lead wirings. A display portion does not have extra space for extra wirings in order to achieve high definition and high aperture ratio, therefore, the lead wirings are formed in the frame region which is outside the display portion.

The aforementioned voltage drop occurs due to current consumed by pixels, however, it occurs due to wiring resistance as well. Since the wiring has more resistance as it becomes thinner, a display device which is required to have a fine wiring pattern has a big problem. In particular, a lead wiring which has to lead a long distance is required to be thick and low in resistance. In an electroluminescent display, in particular, a lead wiring is required to be thicker as compared to that of a liquid crystal display in order to cover a large effect of a voltage drop due to current consumption by pixels. As a result, a wide frame area is required for the electroluminescent display.

In this manner, a lead wiring which is thick and a sectional area of which is large is required to be formed in order to prevent a voltage drop of a voltage supplied to a lead wiring, which obstructs to form a narrower frame. This has been a big problem for a small display in particular. For example, a panel having a display region as large as that of a portable phone has lead wiring portions as long as 2 mm on one side, which makes 4 mm when provided on both sides. Moreover, the lead wiring portion is actually required to be a little more wider in view of preventing a voltage drop, although no wider than 2 mm on one side is available in terms of layout.

In view of the aforementioned problems, the invention provides a display device which has a structure for preventing a voltage drop of a lead wiring as well as a narrower frame is realized.

According to the invention, a narrower frame and suppression of a voltage drop of a lead wiring are realized by providing the lead wiring externally which conventionally occupied a large area in a frame region.

One of the structures of the invention is that a substrate has a pixel portion, a plurality of anode lines or cathode lines formed in stripe shape in the pixel portion, and a plurality of external connecting portions formed with the pixel portion sandwiched therebetween. The external connecting portions are provided on both sides of the anode lines or the cathode lines, and the anode lines or the cathode lines are each connected to the closer external connecting portion.

Another structure of the invention is that a substrate has a pixel portion, a plurality of anode lines or cathode lines formed in stripe shape in the pixel portion, a first wiring connected to all of one side of ends of the anode lines or cathode lines, a second wiring connected to all the other ends of the anode lines or the cathode lines, and a plurality of external connecting portions formed with the pixel portion sandwiched therebetween. The external connecting portions are provided on both sides of the anode lines or the cathode lines, and the first wiring and the second wiring are each connected to the closer external connecting portion.

Another structure of the invention according to the aforementioned structure is that the external connecting portions are attached with a flexible wiring substrate represented by an FPC.

Another structure of the invention according to the aforementioned structure is that the flexible wiring substrate is provided one.

Another structure of the invention according to the aforementioned structure is that the flexible wiring substrate differs depending on the connected external connecting portion.

Another structure of the invention according to the aforementioned structure is that the flexible wiring substrate is formed separately on one side and the other side of the anode lines or the cathode lines.

In this manner, by providing the lead wiring externally and supplying a voltage from the external connecting portion, at least a region of a substrate in which the external connecting portion is not formed can be narrowed. Thus, a display area can be reduced, a display can be increased, and an added value can be increased by mounting a circuit and the like having various functions.

One structure of the invention is that a substrate has a pixel portion, a plurality of anode lines or cathode lines formed in stripe shape in the pixel portion, and a conductive sealing can for sealing the pixel portion, and the anode lines or the cathode lines are electrically connected to the sealing can.

Another structure of the invention is that a substrate has a pixel portion, a plurality of anode lines or cathode lines formed in stripe shape in the pixel portion, and a conductive sealing can for sealing the pixel portion. Both sides of the anode lines or the cathode lines are electrically connected to the sealing can.

Another structure of the invention is that a substrate has a pixel portion, a plurality of anode lines or cathode lines formed in stripe shape in the pixel portion, a first wiring connected to all of one ends of the anode lines or the cathode lines, a second wiring connected to all of the other ends of the anode lines or the cathode lines, and a conductive sealing can for sealing the pixel portion. The first wiring and the second wiring are electrically connected to the sealing can.

In this manner, by removing the lead wiring to supply a voltage and utilizing a sealing can for sealing, at least a portion in which the lead wiring is conventionally formed can be narrowed. Thus, a display area can be decreased, a display can be increased, and an added value can be increased by mounting a circuit and the like having various functions. Moreover, the number of pins can be reduced since it is no longer necessary to supply a voltage to an anode line or a cathode line through an external connecting portion and a flexible wiring substrate (such as an FPC).

By applying a structure of the invention, a portion of a frame region which was conventionally occupied by the lead wiring can be used as a display region, which results in realizing a narrower frame. Further, wiring resistance can also be reduced, which reduces an adverse effect of a voltage drop and improves a display quality. According to the aforementioned effects, a display device which meets users' demands and has a high added value can be provided.

DETAILED DESCRIPTION OF THE INVENTION

Embodiment Mode 1

In this embodiment mode, an example of substituting a lead wiring by a flexible wiring substrate is described with reference to FIGS. 1A to 1C.

Figure 11:
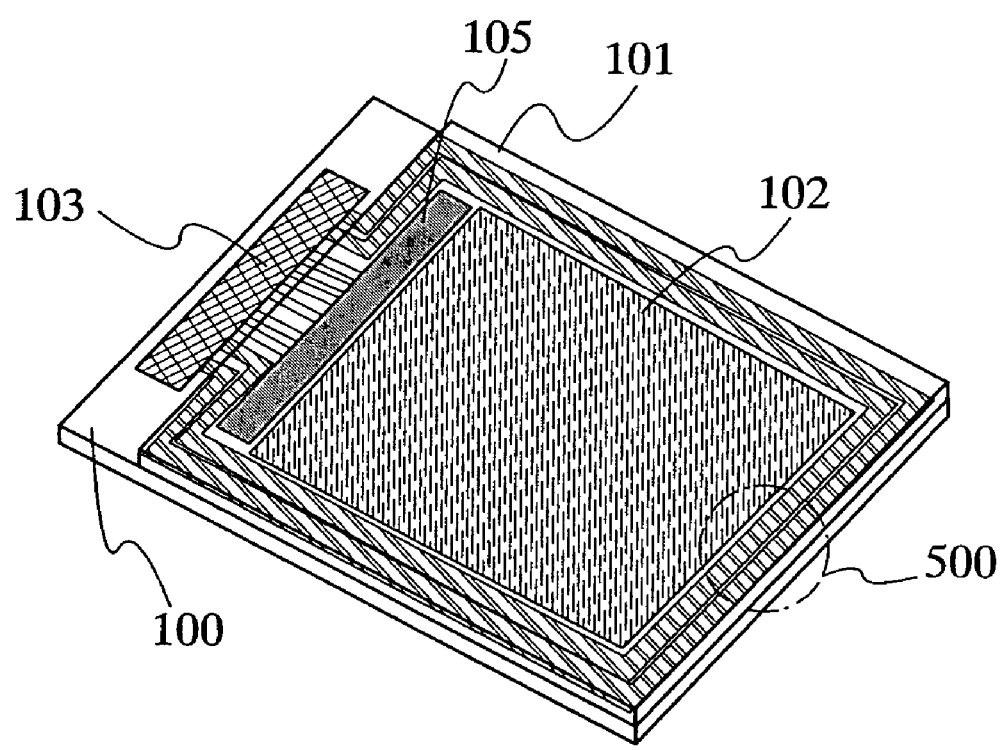
FIG. 11 is a diagram showing a conventional lead wiring.

First, a conventional structure is described with reference to FIG. 11. Reference numeral 100 denotes a substrate, 101 denotes a counter (sealing) substrate, 102 denotes a display portion, 103 denotes an external connecting portion, 105 denotes a driver circuit portion, and 500 denotes a lead wiring. In this manner, the display portion 102 in the conventional structure is quite small relative to a substrate due to the lead wiring 500.

Figure 1A:
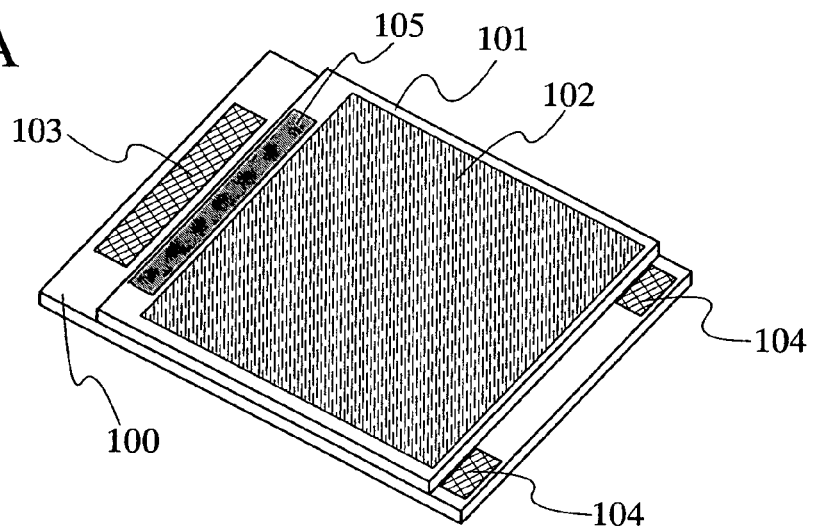
FIGS. 1A to 1C are diagrams showing Embodiment Mode 1.

FIG. 1A shows a panel which is used for an electroluminescent display using the invention. The display portion 102 is formed by sealing electroluminescent elements formed on the substrate 100 with the counter substrate 101. Reference numerals 103 and 104 denote external connecting portions, and 105 denotes a driver circuit portion. Note that anode lines or cathode lines are formed in the display portion 102 of which ends are provided in the external connecting portions 103 and 104.

By providing external connecting portions at two opposite ends of the panel (close to the ends of the anode lines or the cathode lines) to supply a voltage from the closer external connecting portion, a large voltage drop does not occur even when a display portion is increased as compared to the conventional one. Thus, a high quality display can be obtained.

Figure 1B:
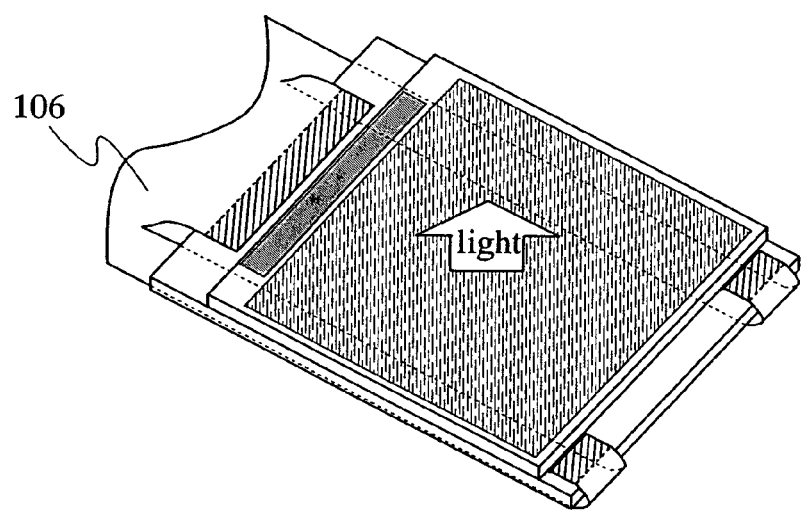
Figure 1C:
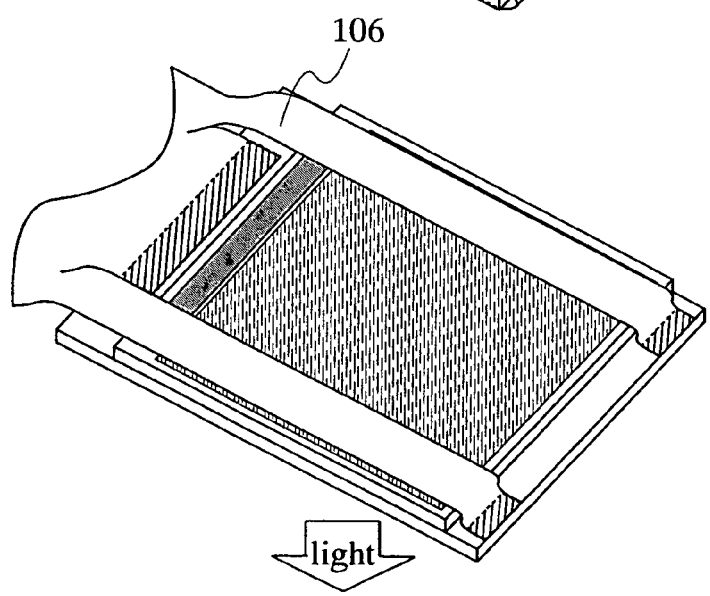

FIGS. 1B and 1C show examples of wirings connected to the external connecting portions 103 and 104. In this embodiment mode, a flexible wiring substrate 106 (such as an FPC) is used for connection as an example.

FIG. 1B shows the case of top emission in which the flexible wiring substrate 106 is connected to the external connecting portion 104 through the back of the substrate, In this structure, the flexible wiring substrate 106 connected to the external connecting portions 103 and 104 is required only one. FIG. 1C shows an example of bottom emission.

Figure 2A:
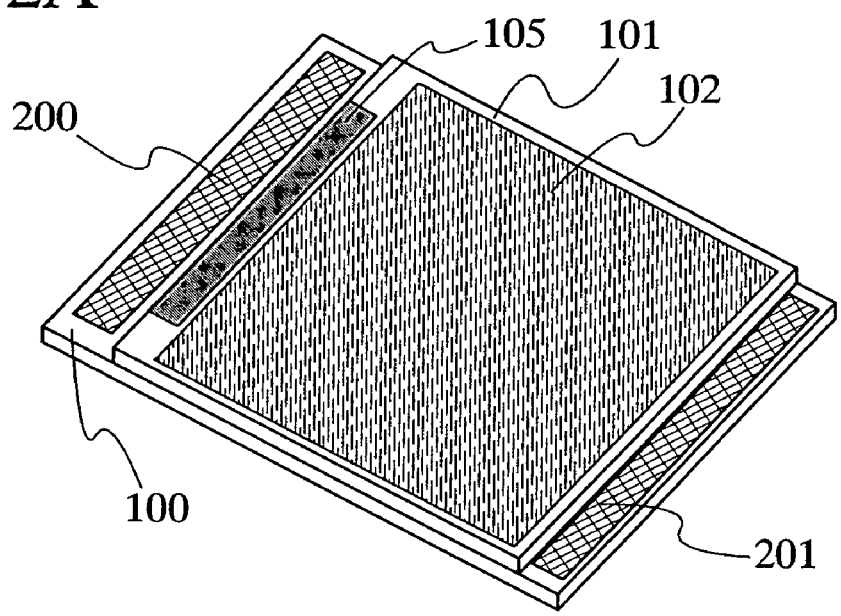
FIGS. 2A and 2B are diagrams showing Embodiment Mode 1.
Figure 2B:
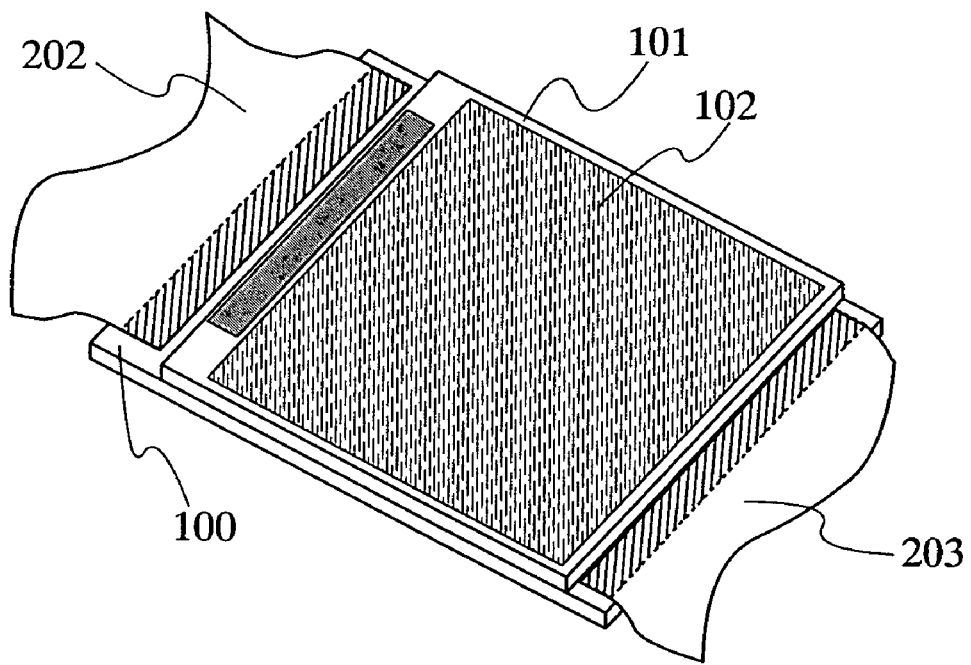

Note that the external connecting portions 103 and 104 may be formed in a different manner and external connecting portions 200 and 201 may be formed as shown in FIG. 2A and two (202 and 203) wirings (flexible wiring substrates in this case) may be connected to the external connecting portions as shown in FIG. 2B as long as the external connecting portions 103 and 104 are connected to both ends of the anode lines or the cathode lines formed in stripe shape. In this case, a dual emission can be employed as well provided that both of the flexible wiring substrates 202 and 203 do not overlap the display portion 102.

Figure 12A:
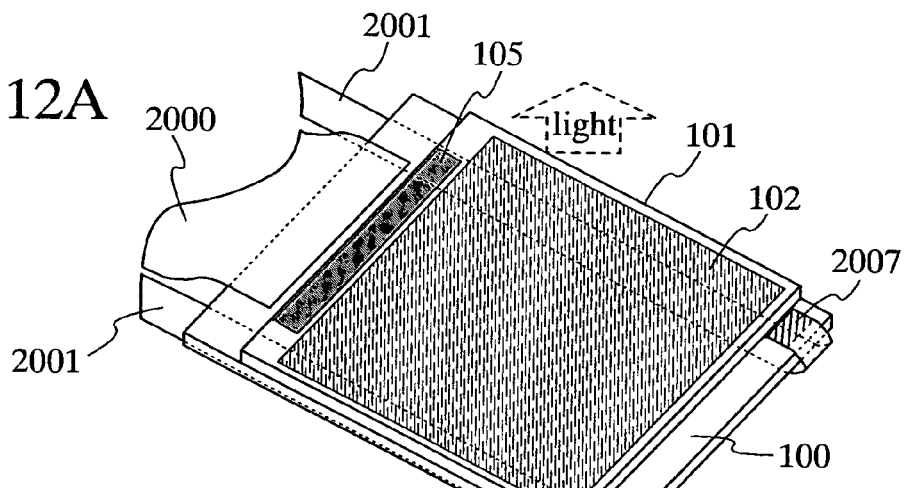
FIGS. 12A to 12C are diagrams showing Embodiment Mode 1.
Figure 12B:
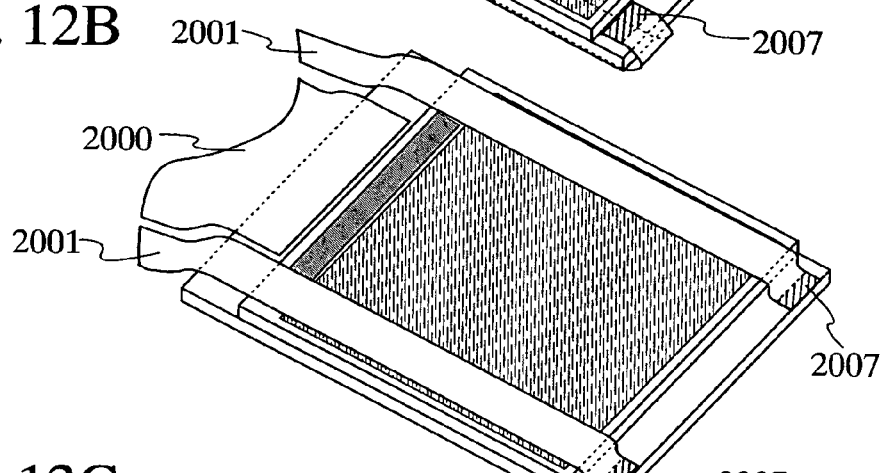
Figure 12C:
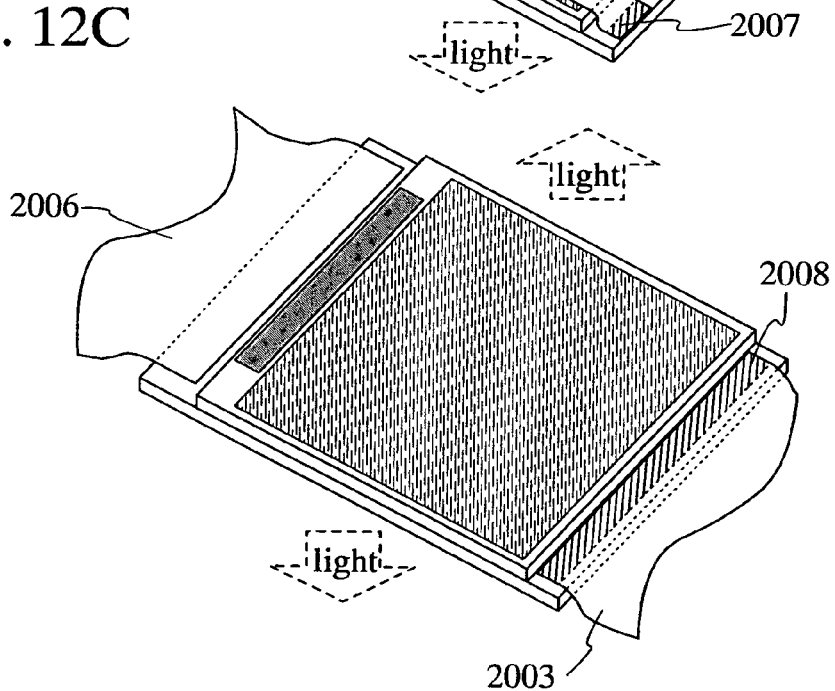
Figure 14:
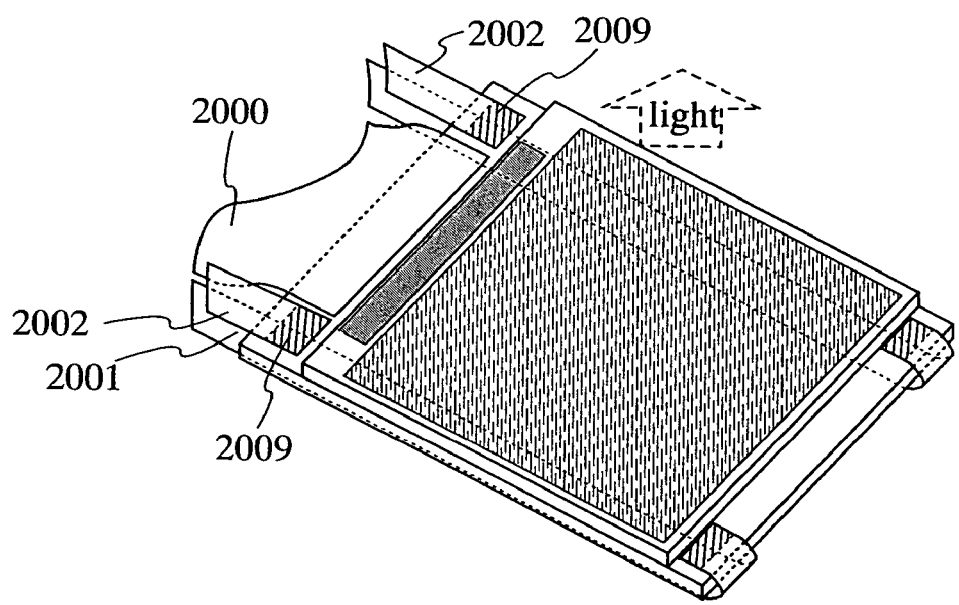
FIG. 14 is a diagram showing Embodiment Mode 1.

Note that conductive ribbons 2001 and 2003 may be used instead of the FPC as shown in FIGS. 12A to 12C. In this case, one ends of the anode lines or the cathode lines are supplied with a voltage from FPCs 2002 and 2006 as shown while the other ends thereof are supplied with a voltage through the conductive ribbons 2001 and 2003. Alternatively, as shown in FIG. 14, an external connecting portion 2009 and conductive ribbons 2002 may be provided additionally to supply a voltage from the conductive ribbons 2000, 2001 and 2002 to both ends of the anode lines or the cathode lines.

The conductive ribbons 2001 in FIGS. 12A and 12B are appropriately adhered at external connecting portions 2007 which correspond to the external connecting portions 103 and 104 in FIGS. 1A to 1C with solder or a conductive adhesive which does not spoil conductivity. FIG. 12A corresponds to FIG. 1B and shows a diagram in the case of substituting the lead wiring by the conductive ribbons 2001 in the case of a structure to emit light upwardly. FIG. 12B corresponds to FIG. 1C and shows a diagram in the case of substituting the lead wiring by the conductive ribbon 2001 in the case of a structure to emit light downwardly. FIG. 12C corresponds to FIG. 2B in which an external connecting portion 2008 corresponding to the external connecting portion 201 in FIG. 2B is electrically in contact with the conductive ribbon 2003 to supply a voltage to one ends of the anode lines or the cathode lines. The FPC 2006 in FIG. 12C corresponds to the FPC 202 in FIG. 2B.

A commercial conductive tape or the like which is applied with an adhesive on the adhesive surface in advance can be used for the conductive ribbons 2001 as well.

Figure 13A:
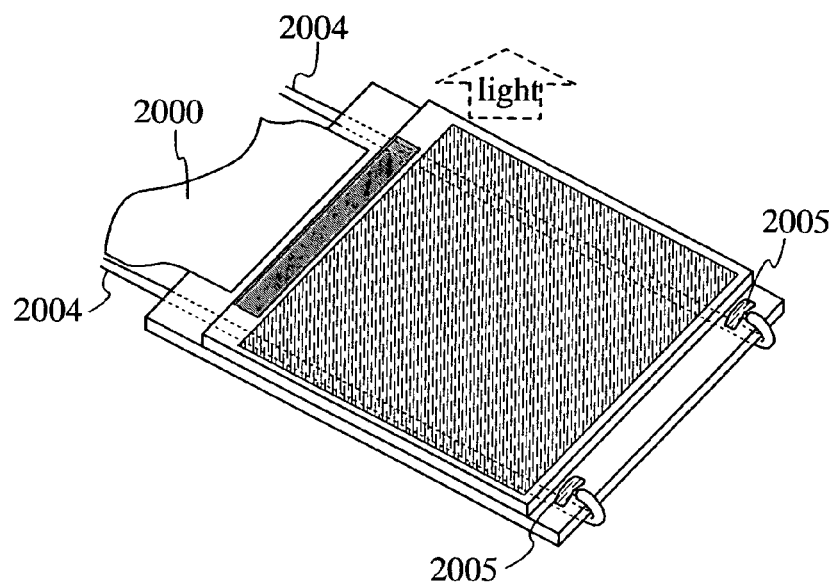
FIGS. 13A and 13B are diagrams showing Embodiment Mode 1.
Figure 13B:
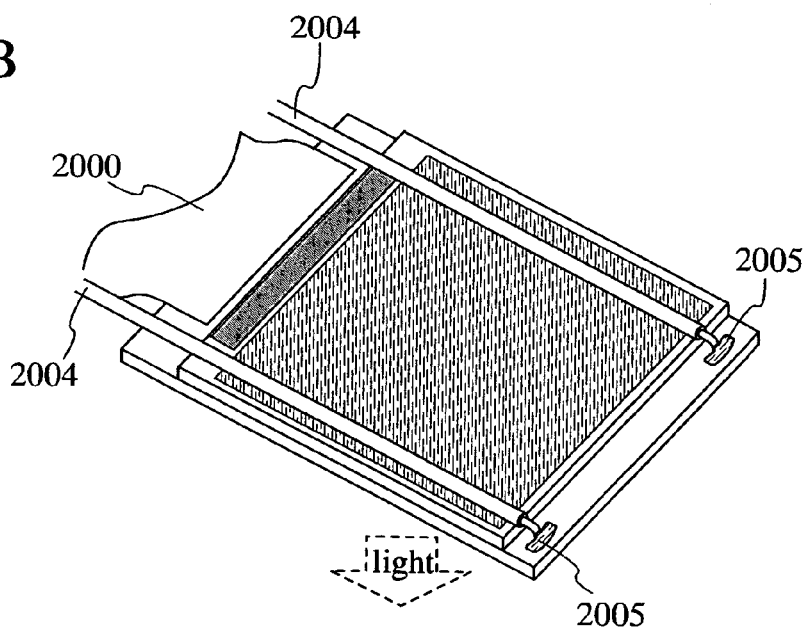

FIGS. 13A and 13B are examples of using conductive lines 2004 instead of the FPC. In this case also similarly to FIGS. 12A to 12C, one ends of the anode lines or the cathode lines may be supplied with a voltage from the FPC 2000 while the other ends thereof may be supplied with a voltage through the conductive lines 2004. Otherwise, an external connecting portion and a conductive line may be provided additionally as shown in FIG. 14 to supply a voltage from the conductive line to both ends of the anode lines or the cathode lines although they are not shown.

The conductive lines 2004 may be adhered appropriately with solder and the like at the external connecting portions 2005 which correspond to the external connecting portions 103 and 104 in FIGS. 1A to 1C. FIG. 13A corresponds to FIG. 1B and shows the case of substituting the lead wiring by the conductive lines 2004 in the case of a structure to emit light upwardly. FIG. 13B corresponds to FIG. 1C and shows the case of substituting the lead wiring by the conductive line 2004 in the case of a structure to emit light downwardly.

Note that the conductive lines 2004 may be covered with an insulating film in a portion besides the portion which is required to be electrically in contact, although it is not necessarily formed. A material of the conductive lines is not limited, however, it is preferably low in resistance such as copper, silver, gold, and aluminum.

In this manner, the conductive ribbons 2001 or the conductive lines 2004 may be used instead of the lead wiring. Furthermore, it is needless to say that other conductors can be applied as well instead of the lead wiring as long as the gist of the invention is not changed.

Embodiment Mode 2

In this embodiment mode, an example of substituting the lead wiring by a sealing can is described with reference to FIGS. 3A to 3C.

Figure 3A:
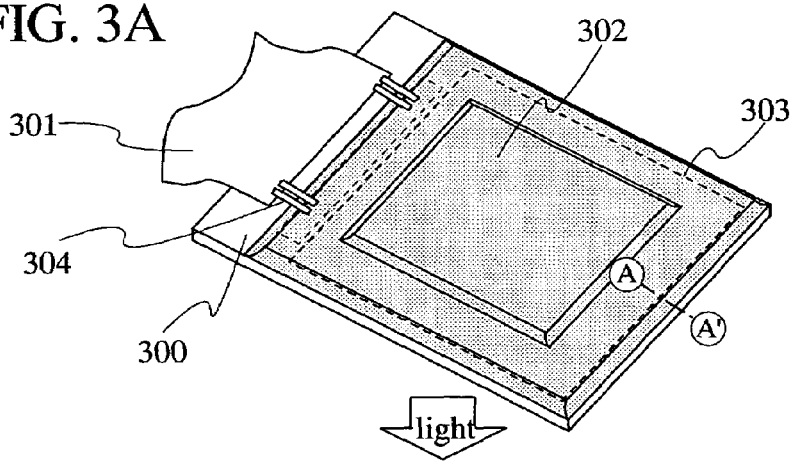
FIGS. 3A to 3C are diagrams showing Embodiment Mode 2.

FIG. 3A is a perspective view which realizes the structure of the invention by using a sealing can. A substrate 300, a flexible wiring substrate 301, a sealing can 302, a display portion 303, and a voltage supply portion 304 for the sealing can 302 are provided. In this structure, ends of the anode lines or the cathode lines on the flexible wiring substrate 301 side are supplied with a voltage from the flexible wiring substrate 301 and a voltage is supplied to the other ends thereof which are far from the flexible wiring substrate 301 through the sealing can.

Figure 3B:
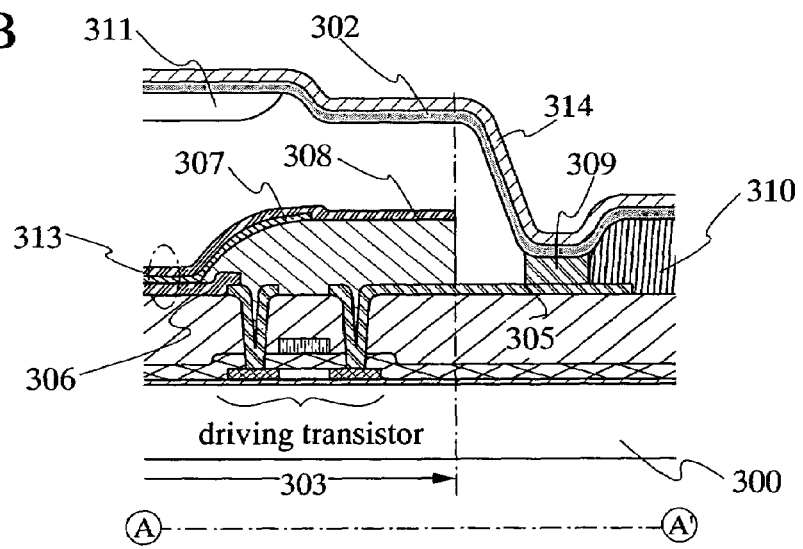
Figure 3C:
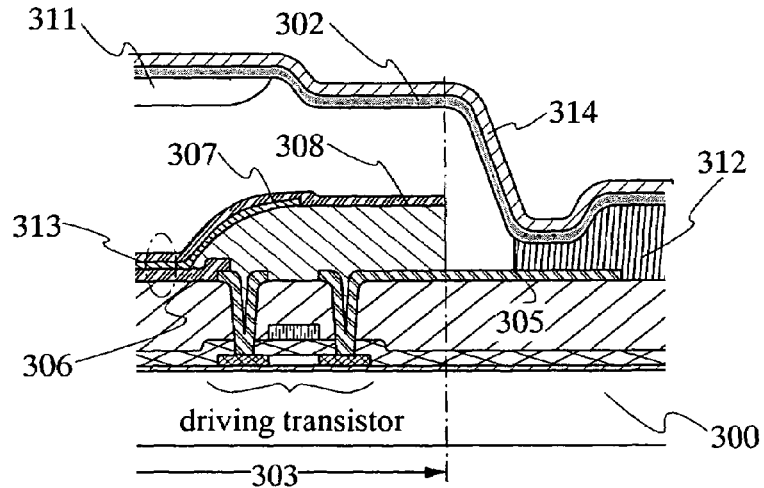

FIGS. 3B and 3C are sectional views of a portion (A-A' in the perspective view) in which a voltage is supplied from the sealing can 302 to the anode lines or the cathode lines. A driving transistor (P-channel type) for driving a light emitting element 313 is formed in a display region on a substrate 300, of which source side is connected to the anode lines. In this case, reference numeral 306 denotes an anode of the light emitting element 313, 307 denotes a light emitting layer containing an organic compound, and 308 denotes a cathode of the light emitting element 313. In this embodiment mode, 306 denotes the anode of the light emitting element 313, however, in the case where 306 denotes the cathode, 308 denotes the anode of the light emitting element, 305 denotes a cathode line, and the driving transistor is N-channel type, although most part is the same. The light emitting element 313 in the display portion 303 is sealed with the sealing can 302 provided with a drying agent 311 internally. After that, an insulating film 314 is formed on the sealing can 302 to prevent a short-circuit and the like with other portions.

Figure 4A:
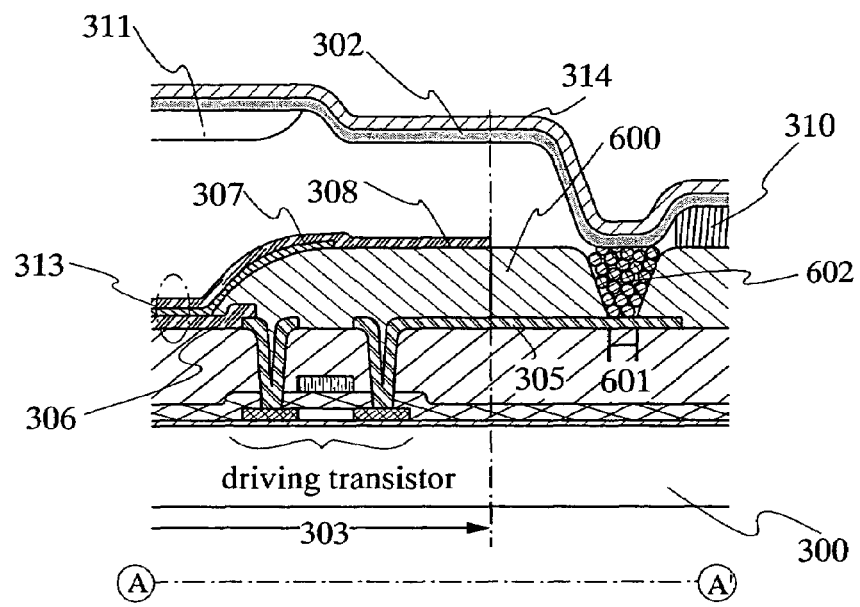
FIGS. 4A and 4B are diagrams showing Embodiment Mode 2.
Figure 4B:
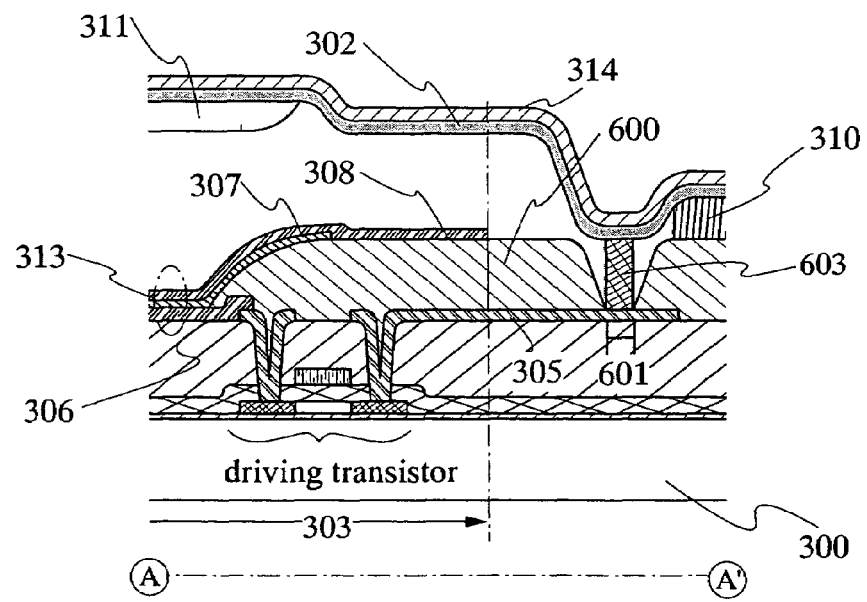

Reference numerals 310 and 312 denote sealants. The sealant 310 is an insulating sealant in which the anode line 305 and the sealing can 302 are conductive with a conductive material 309. The conductive material 309 may be anything as long as the anode line 305 and the sealing can 302 are conductive. The anode line and the sealing can are able to be conductive by such ways that a viscous liquid dispersed with conductive particles is applied by ink-jetting, an opening portion 601 which reaches the anode line is formed in an insulating film 600 which is referred to as a bank and conductive particles 602 such as solder balls are filled therein or liquid dispersed with conductive particles is poured therein as shown in FIG. 4A, or a conductive filler 603 is provided in the opening portion 601 as shown in FIG. 4B. It is preferable that the conductive material 309, the conductive particles 602, and the filler 603 have elasticity to facilitate the conductivity between the sealing can and the anode line. The sealant 312 is a conductive sealant through which the anode line 305 and the sealing can 302 are conductive as shown in FIG. 4B.

Figure 5A:
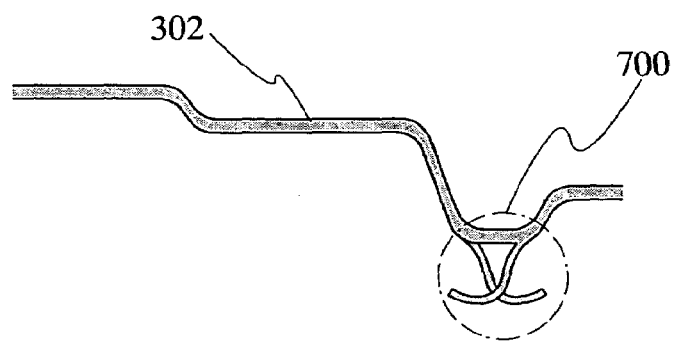
FIGS. 5A and 5B are diagrams showing Embodiment Mode 2.
Figure 5B:
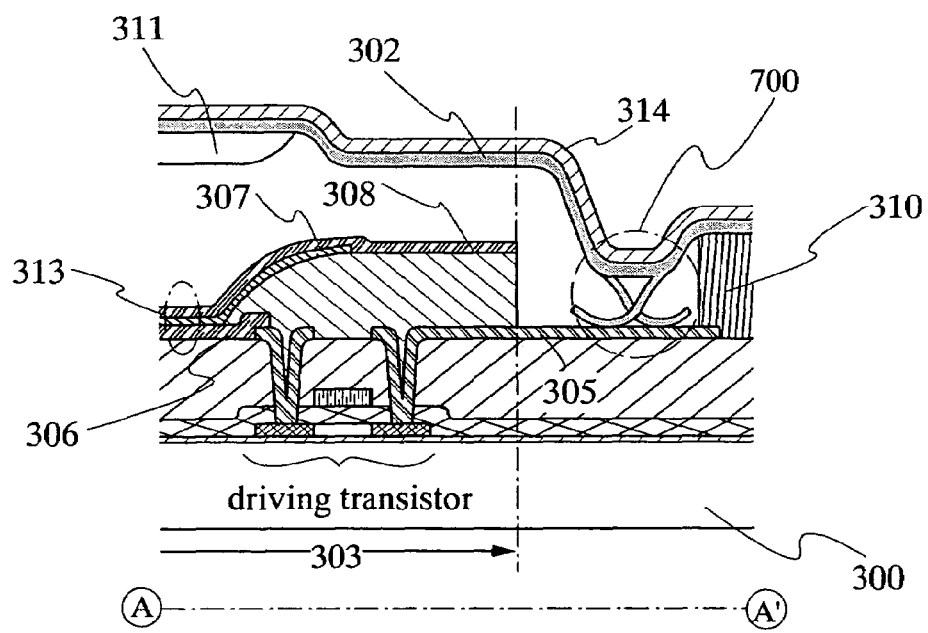

As shown in FIG. 5B, a spring 700 having elasticity may be provided in a portion of the sealing can which is to be electrically connected to the anode line. It is needless to say that the spring 700 is not limited in a shape shown in FIG. 5A and may be anything as long as it has elasticity, a shape and a material which cause sufficient electrical connection with the anode lines or the cathode lines. Further, a combination with the aforementioned conductive methods is more effective.

The sealing can 302 is often stainless, however, an Ni/stainless steel clad is a preferable material since it lowers contact resistance and enhances workability. It is needless to say that other materials can be used also as long as it is a material which prevents a substance that adversely affects an electroluminescent element and can be processed into a shape that can be used for the invention.

Further, the number of pins which were occupied for supplying a voltage to the anode lines or the cathode lines in the external connecting portion such as a flexible wiring substrate can be reduced by supplying a voltage from the sealing can to both ends of the anode lines or the cathode lines and supplying a voltage directly from an external power source circuit to the sealing can.

In this manner, by using the sealing can 302 as a wiring for supplying a voltage to the anode lines or the cathode lines instead of the lead wiring, a large voltage drop does not occur and a high quality display can be obtained even when a ratio of a display portion area is increased as compared to the conventional one.

Embodiment Mode 3

Figure 6A:
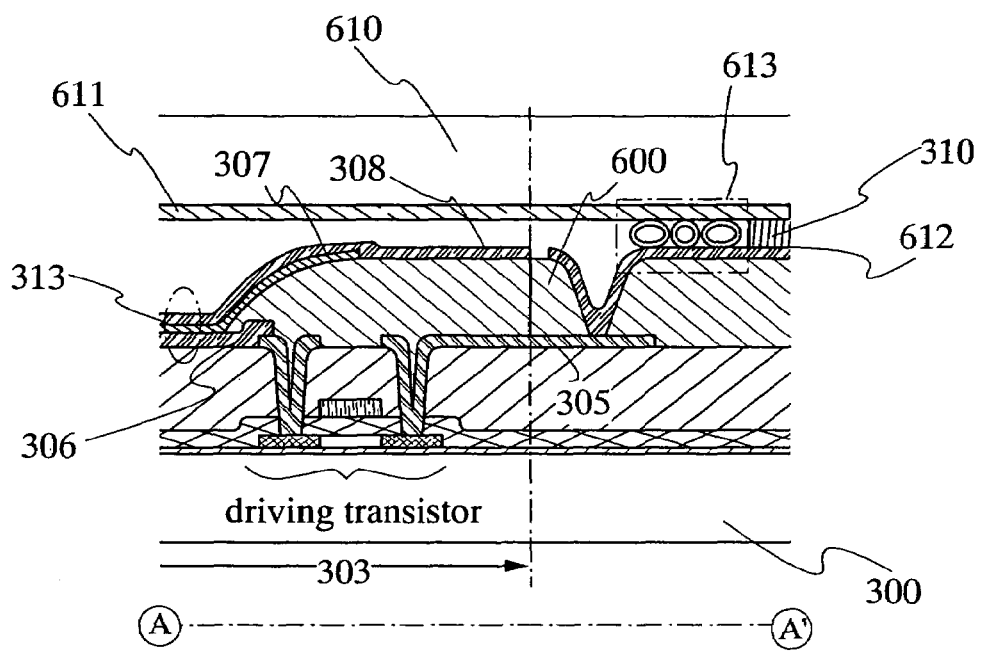
FIGS. 6A and 6B are diagrams showing Embodiment Mode 3.
Figure 6B:
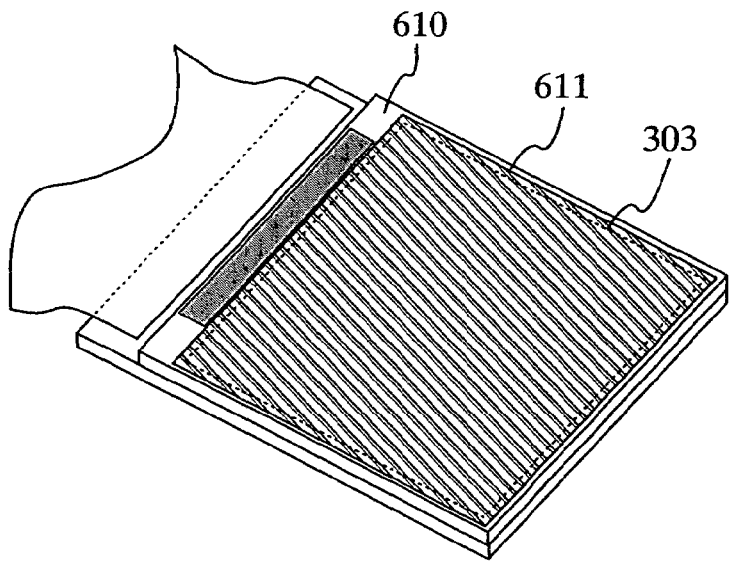

In this embodiment mode, another structure of the invention is described with reference to FIGS. 6A and 6B. In this embodiment mode, an example of forming a conductive film as a substitute for a lead wiring on a counter substrate is described.

A counter substrate is used when sealing an element substrate over which electroluminescent elements are formed with a sealant such as an ultraviolet curing resin. The electroluminescent elements can be blocked from the outside air by being sealed with the sealant and the counter substrate, resulting in improved reliability.

In this embodiment mode, a conductive film is formed on the counter substrate as a substitute for the lead wiring, a voltage is supplied to the conductive film, and a voltage is supplied to anode lines or cathode lines by causing the conductivity between the conductive film and the anode lines or the cathode lines.

The conductive film formed on the counter substrate may have any shape, although it is preferable that a sectional area taken by cutting in the direction of film thickness is as large as possible in order to make wiring resistance as small as possible. That is, it is preferable that the film thickness is as thick as possible and a film formation region in a direction which crosses the stripe shape of the anode lines or the cathode lines at right angle is as large as possible.

There are three major display methods of the electroluminescent display panel, which are a bottom emission in which light is emitted to an element substrate side, a top emission in which light is emitted to a counter substrate side, and a dual emission in which light is emitted to both of them.

As light is emitted to the element substrate side in the case of the bottom emission, a conductive film which is formed on the counter substrate as a substitute for a lead wiring does not have to transmit light. It is possible to employ a highly conductive material appropriately which is easily formed, such as aluminum and silver.

However, light is emitted to the counter substrate side in the top emission and dual emission, therefore, the conductive film which is formed on the counter substrate as a substitute for a lead wiring is required to transmit light. ITO (indium tin oxide), IZO (indium zinc oxide) obtained by mixing 2 to 20% of zinc oxide (ZnO) with indium oxide, ITSO obtained by mixing 2 to 20% of silicon oxide ($SiO_2$) with indium oxide, and the like are examples of a material which transmits light and has conductivity. Any material may be used besides the aforementioned materials as long as it transmits light and has conductivity rate sufficient for use.

The conductive film formed on the counter substrate and the anode lines or the cathode lines may be connected by a similar method to Embodiment Mode 2 or a known method, which depends on a practitioner. FIGS. 6A and 6B show examples of connection. A conductive film 611 formed on a counter substrate 610 is supplied with a voltage from an external power source circuit. A leading-out wiring 612 is formed on the anode line 305 connected to a driving transistor at the same time as forming an anode of the electroluminescent element 313 through a contact formed in an insulating film 600 called a bank. The leading-out wiring 612 is connected to the conductive film 611 through conductive particles 613. The anode line 305 is supplied with a voltage from the conductive film 611.

In this manner, by using the conductive film 611 formed on the counter substrate 610 as a substitute for the lead wiring for supplying a voltage to the anode lines or the cathode lines, a large voltage drop does not occur and a high quality display can be obtained even when a ratio of a display portion area is increased as compared to the conventional one.

Figure 15A:
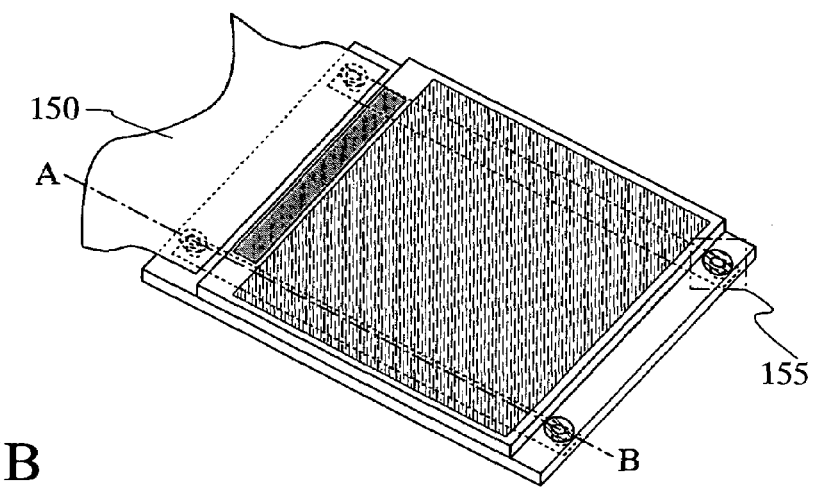
FIGS. 15A and 15B are diagrams showing Embodiment Mode 3.
Figure 15B:
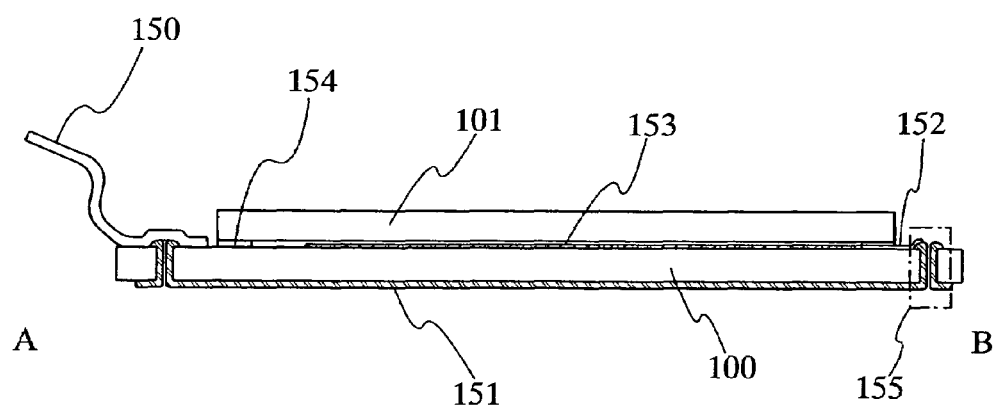

Further, a conductive film used as a substitute for the lead wiring may be formed not only on a surface of the counter substrate 101 on the element substrate 100 side, but also on an opposite surface to a surface on which elements are formed on the element substrate 100 as shown in FIGS. 15A and 15B. Alternatively, the conductive film may be formed on an opposite surface of the counter substrate 101 to the element substrate 100 as well, although not shown. The conditions regarding the shape and material are similar to those in the case of forming the conductive film on the surface of the counter substrate 101 facing the element substrate 100. In this case, a through hole 155 is provided on the substrate as shown in FIGS. 15A and 15B when connecting the conductive film to the anode lines or the cathode lines. By providing the through hole 155, a material of the conductive film 151 spreads to the opposite side of the substrate to the surface on which the conductive film 151 is formed, thus conductivity can be obtained on the opposite side of the substrate. Moreover, a conductive ribbon, a conductive tape and the like described in Embodiment Mode 1 may be used for obtaining conductivity as well.

Note that the conductive film 151 is supplied with a voltage from the FPC 150 in FIGS. 15A and 15B, however, the conductive film 151 may be supplied with a voltage in any way as long as a desired voltage is supplied by some conductor as well as FPC. Note that the counter substrate 101 and the element substrate 100 are adhered with a sealant 154. A voltage supplied by the conductive film 151 is supplied to anode lines or cathode lines of a display portion 153 through a leading-out wiring 152.

Embodiment Mode 4

In this embodiment mode, a wiring for supplying a voltage to anode lines or cathode lines is briefly described with reference to FIGS. 7A to 7D. Reference numeral 400 denotes a pixel portion in which a plurality of anode lines or cathode lines are formed in stripe shape. All of one ends of the anode lines or the cathode lines is connected to one wiring while all the other ends is connected to another wiring. FIGS. 7A to 7D are diagrams showing only wirings which have connections with an input to the anode lines or the cathode lines.

Figure 7A:
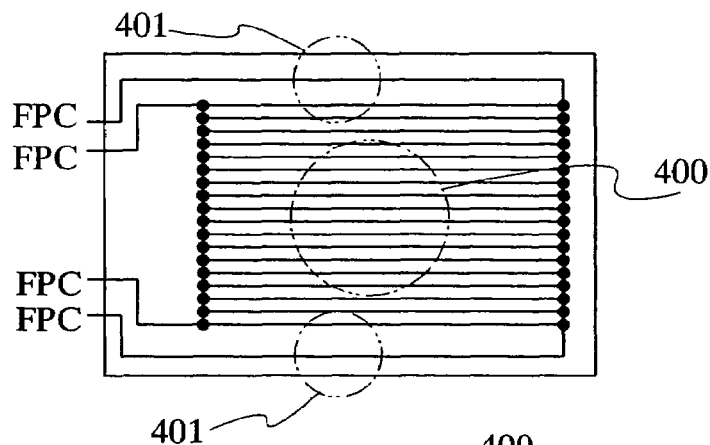
FIGS. 7A to 7D are diagrams showing Embodiment Mode 4.

FIG. 7A shows a wiring diagram of a conventional panel on which lead wirings are formed. Anode lines or cathode lines are formed in stripe shape in the pixel portion 400. Ends of the anode lines or the cathode lines are provided on an external connecting portion side such as a flexible wiring substrate and the opposite side to it. A voltage is supplied from the external connecting portion to each of them. The lead wirings are connected to the opposite side to the external connecting portion through a lead wiring portion 401. In order to prevent an effect of a voltage drop, the lead wirings have to be thick. Accordingly, a region available to be used as a pixel portion is narrowed.

Figure 7B:
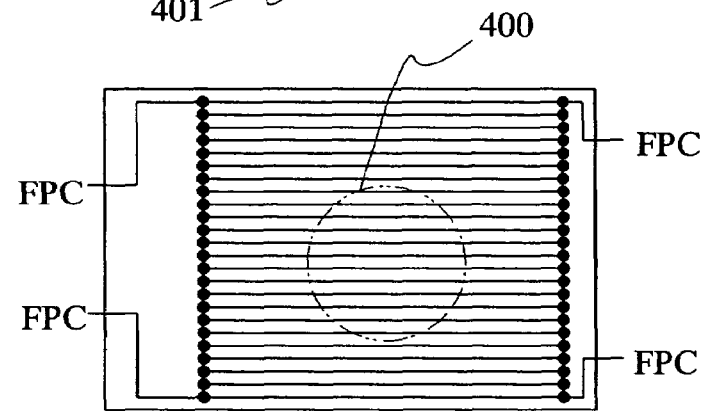

FIG. 7B shows a panel formed by using one of the structures of the invention. External connecting portions are provided on both ends of the anode lines or the cathode lines and a voltage is supplied from the closer external connecting portions respectively. As the lead wiring portions are not required anymore, it is appreciated that a ratio occupied by a display portion area is increased. Moreover, as a wiring of which width is of less importance such as a flexible wiring substrate is used for supplying a voltage, a voltage drop is less likely to occur. Accordingly, a high quality display with a narrow frame area can be fabricated.

Figure 7C:
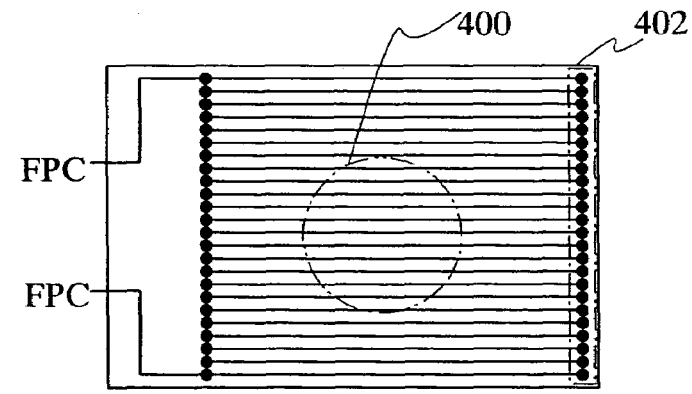

FIG. 7C shows a panel formed by using one of the structures of the invention. The ends of the anode lines or the cathode lines on the side that the external connecting portions are provided are supplied with a voltage from the external connecting portions while the other ends are supplied with a voltage by using a sealing can or a conductive film formed on the counter substrate. A reference numeral 402 denotes a portion to which a voltage is supplied from a sealing can or the conductive film formed on the counter substrate. As the lead wiring portions are not required anymore, it is appreciated that a ratio occupied by a display portion area is increased. Moreover, as a sealing can with a large sectional area or a conductive film formed on the counter substrate is used as a wiring for supplying a voltage, a voltage drop is less likely to occur. Accordingly, a high quality display with a narrow frame area can be fabricated.

Figure 7D:
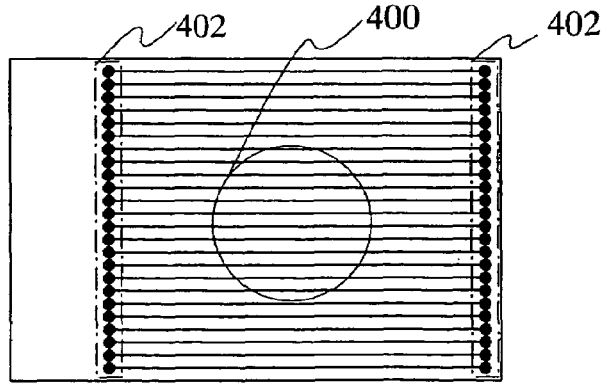

FIG. 7D shows a panel formed by using one of the structures of the invention. A sealing can or a conductive film formed on the counter substrate is provided on both ends of the anode lines or the cathode lines for supplying a voltage. In a portion 402, a voltage is supplied from the sealing can or the conductive film formed on the counter substrate. As the lead wiring portions are not required anymore, it is appreciated that a ratio occupied by a pixel portion area is increased. Moreover, as a sealing can with a large sectional area or a conductive film formed on the counter substrate is used as a wiring for supplying a voltage, a voltage drop is less likely to occur. Further, the number of pins is reduced since a voltage is not supplied to the anode lines or the cathode lines from the external connection portions, which makes a layout easier or allows other useful data to be supplied to the panel. Accordingly, a high quality display with a narrower frame area can be fabricated.

EMBODIMENT 1

In this embodiment, a method for fabricating a thin film transistor, a capacitor, and an electroluminescent device by using the invention is described with reference to FIGS. 8A to 8D and 9A and 9B.

First, an amorphous semiconductor film is formed after forming a base insulating film 801 on a substrate 800. By crystallizing the amorphous semiconductor film by using an element which promotes crystallization, a crystalline semiconductor film is formed.

The substrate 800 may be an insulating substrate such as a glass substrate, a quartz substrate, and a crystalline glass, a ceramic substrate, a stainless substrate, a metal substrate (tantalum, tungsten, molybdenum and the like), a semiconductor substrate, a plastic substrate (polyimide, acryl, polyethylene terephthalate, polycarbonate, polyarylate, polyether sulfone and the like), and the like as long as it can at least resist the heat during the process. In this embodiment, a glass substrate is used.

The base insulating film 801 is provided for preventing alkaline metal and alkaline earth metal in the substrate 800 from dispersing into the crystalline semiconductor film. Such elements can adversely affect the semiconductor characteristics of the crystalline semiconductor film. The base insulating film 801 can be formed by using silicon oxide, silicon nitride, silicon oxynitride, silicon nitride oxide and the like in a single or laminated structure. Note that the base insulating film is not required for a substrate which is free from a fear of dispersion of alkaline metal and alkaline earth metal.

In this embodiment, the base insulating film 801 is formed in a laminated structure of which first insulating layer is formed of silicon nitride oxide in thickness of 50 nm, and second insulating layer is formed of silicon oxynitride in thickness of 100 nm. Note that a silicon nitride oxide film and a silicon oxynitride film are different in the ratio of nitrogen and oxygen. The former has more content of nitrogen. The first base film is formed by plasma CVD with $SiH_4$, $N_2O$, $NH_3$, and $H_2$ as material gases, at a pressure of 0.3 Torr, an RF power of 50 W, an RF frequency of 60 MHz, and a substrate temperature of 400° C. The second base film is formed by plasma CVD with $SiH_4$ and $N_2O$ as material gases, at a pressure of 0.3 Torr, an RF power of 150 W, an RF frequency of 60 MHz, and a substrate temperature of 400° C.

Subsequently, an amorphous semiconductor film is formed. In this embodiment, an amorphous silicon film is formed in thickness of 25 to 100 nm (preferably 30 to 60 nm) on the base insulating film. It may be formed by a known method such as sputtering, low pressure CVD, and plasma CVD. In this embodiment, plasma CVD is employed to form in thickness of 50 nm.

Subsequently, the amorphous semiconductor film is crystallized. The crystallization is performed by thermal treatment by using an element which promotes crystallization of the amorphous semiconductor film. The element which promotes the crystallization is represented by nickel, by using which the crystallization is performed at a lower temperature in a shorter time as compared to the case of not using such element. Therefore, such element is preferably used in the case of using a substrate which is relatively sensitive to heat such as a glass substrate. Examples of such element which promotes crystallization are iron, palladium, tin, lead, cobalt, platinum, copper, gold and the like as well as nickel. One or a plurality of the aforementioned elements can be used.

Such elements can be added by, for example, spin coating, dipping, and the like by dissolving salts of such elements into solvent. Organic solvent, water and the like can be used as the solvent, however, it is important to select the one which does not adversely affect semiconductor characteristics as it touches the semiconductor film directly. The same applies to the salt as well.

In this embodiment, an example of using Ni as the element which promotes crystallization is described. It is preferable to use Ni as 10 ppm aqueous solution of acetate or nitrate. Before this aqueous solution is applied on the amorphous silicon film by spin coating, it is preferable to form a very thin oxide film by processing the surface of the amorphous silicon film with ozone water and the like in advance since hydrophobic surface of the silicon film may disturb uniform application.

The element which promotes crystallization may be added to the amorphous silicon film by other methods such as ion implantation, thermal treatment water in vapor atmosphere containing Ni, and sputtering using Ni material as a target.

Subsequently, the amorphous silicon film is crystallized by thermal treatment. Since a catalytic element is used, the thermal treatment may be performed at 500 to 650° C. for about 2 to 24 hours. By this crystallization treatment, the amorphous semiconductor film is formed into a crystalline semiconductor film. At this time, the magnetic field may be applied to combine magnetic field energy with the thermal treatment for the crystallization or high output microwave may also be used. In this embodiment, a vertical furnace is used to perform the thermal treatment at 550° C. for 4 hours after the thermal treatment at 500° C. for 1 hour to the amorphous silicon film to form the crystalline silicon film.

Subsequently, laser crystallization may be performed. Crystallinity is enhanced by reducing defects in the crystalline semiconductor film. The laser crystallization may be performed by using a pulse oscillation type or continuous oscillation type gas or solid, or a metal laser oscillation device. A gas laser includes an excimer laser, an Ar laser, a Kr laser and the like, a solid laser includes a YAG laser, a $YVO_4$ laser, a YLF laser, a $YAlO_3$ laser, a glass laser, a ruby laser, an alexandrite laser, and a sapphire laser, and a metal laser includes a helium cadmium laser, a copper vapor laser, a metal vapor laser and the like. One or a plurality of $Cr^{3+}$, $Cr^{4+}$, $Nd^{3+}$, $Er^{3+}$, $Ce^{3+}$, $Co^{2+}$, $Ti^{3+}$, $Yb^{3+}$ and $V^{3+}$ is doped as an impurity to the crystal as a laser medium of the solid laser.

The laser oscillated by the laser oscillation device is preferably irradiated by using an optical system to be linear. A linear laser can be obtained by using a cylindrical lens, a convex mirror and the like that are typically used. As irradiation conditions, a power density is about 0.01 to 100 $MW/cm^2$, and an irradiation atmosphere is atmospheric air, atmosphere controlled in oxygen concentration, $N_2$ atmosphere or vacuum. Moreover, in the case of using a pulse oscillation laser, it is preferable that a frequency is 30 to 300 Hz and a laser energy density is 100 to 1500 $mJ/cm^2$ (typically 200 to 500 $mJ/cm^2$). At this time, the laser light may be overlapped by 50 to 98% by calculating with FWHM of a laser beam. Note that a crystallization atmosphere in this embodiment is atmospheric air. By irradiating laser in the atmospheric air in this embodiment, a silicon oxide film which is a native oxide film is formed on the crystalline silicon film. This film is preferably removed since the quality thereof cannot be controlled.

In this case, even when nickel and/or nickel silicide segregate in the crystalline silicon film of under layer, only the silicon oxide film can be etched selectively by using mixture solution of solution containing fluorine and solution containing a substance which exhibits surface activity. Accordingly, it can be prevented that holes are formed in the crystalline silicon film.

Subsequently, a silicon oxide film is formed on the crystalline semiconductor film. The silicon oxide film is formed by irradiating UV light in oxygen atmosphere, thermal oxidization, a treatment by ozone water containing hydroxy radical or hydrogen peroxide, and the like. Next, a gettering site is formed by sputtering and CVD. A gettering site, when formed by sputtering, is formed by accumulating an amorphous silicon film containing argon element in thickness of 50 nm. Deposition conditions are that a deposition pressure: 0.3 Pa, a gas (Ar) flow: 50 (sccm), a deposition power: 3 kW, and a substrate temperature: 150° C. Note that atomic percentage of argon element contained in the amorphous silicon film under the aforementioned condition is $3 \times 10^{20}/cm^3$ to $6 \times 10^{20}/cm^3$, and atomic percentage of oxygen is about $1 \times 10^{19}/cm^3$ to $3 \times 10^{19}/cm^3$. After that, gettering is performed by thermal treatment at a temperature of 650° C. for 3 minutes by using a rapid annealing device.

By thermal treatment, at least a part of the elements which promote crystallization in the crystalline semiconductor film moves to the gettering site. According to this thermal treatment, a native oxide film formed of a silicon oxide film is formed on the gettering site.

After that, the native oxide film is removed by solution containing fluoride and a substance which exhibits surface activity. Then, the gettering site is heated at about 60° C. by using aqueous solution containing TMAH (Tetra Methyl Ammonium Hydroxide) and then etched.

After that, a silicon oxide film used as an etching stopper for gettering is etched and removed by solution containing fluoride and a substance which exhibits surface activity. The silicon oxide film used as an etching stopper film is preferably removed since it possibly contains a lot of nickel, which may contaminate an active layer during subsequent steps.

Subsequently, a trace impurity for controlling a threshold value is added to the crystalline semiconductor film as required, that is, channel doping is performed. In order to obtain a required threshold value, boron, phosphorus, or the like is added by ion doping and the like.

Figure 8A:
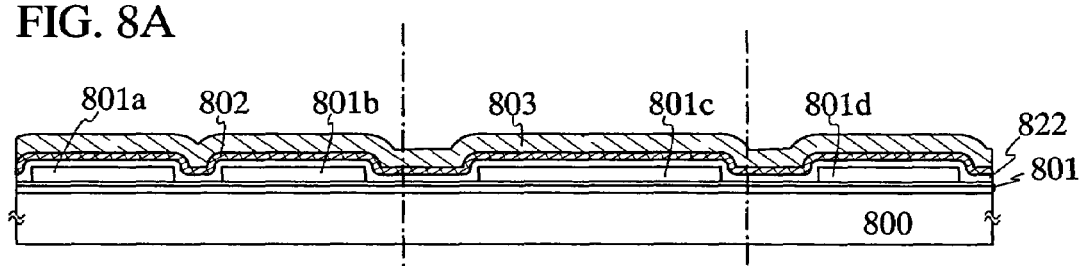
FIGS. 8A to 8D are diagrams showing processes of Embodiment 1.

After that, island-shaped crystalline semiconductor layers 801a to 801d are obtained by patterning into predetermined shapes as shown in FIG. 8A. The patterning is performed by using a mask formed on a crystalline semiconductor film by applying photo resist on the crystalline semiconductor film, exposing a predetermined mask shape and baking. By using this mask, the crystalline semiconductor film is etched by dry etching. The dry etching is performed by using gas of $CF_4$, $O_2$ and the like.

Subsequently, a gate insulating film 822 is formed so as to cover the crystalline semiconductor layers 801a to 801d. The gate insulating film 822 is formed of an insulating film containing silicon by plasma CVD or sputtering in thickness of 40 to 150 nm. In this embodiment, the gate insulating film 822 is formed of a silicon oxynitride film by plasma CVD in thickness of 115 nm.

Subsequently, a tantalum nitride (TaN) 802 in thickness of 30 nm is formed as a first conductive layer on the gate insulating film and a tungsten (W) 803 is formed in thickness of 370 nm as a second conductive layer thereon. Both the TaN film and the W film may be formed by sputtering. The TaN film may be formed by using Ta as a target in nitrogen atmosphere while the W film may be formed by using W as a target.

In this embodiment, the first conductive layer is formed of TaN in thickness of 30 nm and the second conductive layer is formed of W in thickness of 370 nm, however, both of the first conductive layer and the second conductive layer may be formed of an element selected from Ta, W, Ti, Mo, Al, Cu, Cr, and Nd, or an alloy material or a compound material containing the aforementioned element as a main component. Moreover, a semiconductor film represented by a polycrystalline silicon film which is doped with an impurity element such as phosphorus may be used as well. Moreover, an Ag—Pd—Cu alloy may be used. Further, the combination thereof may be appropriately selected. The thickness of the first conductive layer may be 20 to 100 nm while that of the second conductive layer may be 100 to 400 nm. Further, a lamination structure of two layers is employed in this embodiment, however, a single layer or a lamination of three of more layers may be employed as well.

Subsequently, in order to form electrodes and wirings by etching the conductive layer, a mask of resist is formed through exposure step by photolithography. In the first etching treatment, etching is performed by a first etching condition and a second etching condition. A gate electrode and a wiring are formed by etching using a mask of resist. An etching condition may be selected appropriately.

In this embodiment, ICP (Inductively Coupled Plasma) etching is employed. As the first etching condition, $CF_4$, $Cl_2$, and $O_2$ are used as etching gases, of which gas flow rate is 25/25/10 (sccm), with a pressure of 1.0 Pa, and plasma is generated by applying an RF power (13.56 MHz) of 500 W to a coil type electrode. A substrate side (sample stage) is also applied with an RF (13.56 MHz) power of 150 W, thus negative self bias voltage is substantially applied. By the first etching condition, the W film is etched to form the ends of the first conductive layer in tapered shapes.

Subsequently, etching is performed under the second etching condition. With the mask of resist remaining, etching is performed for about 15 seconds by using $CF_4$ and $Cl_2$ as etching gases of which gas flow rate is 30/30 (sccm), with a pressure of 1.0 Pa, and by applying an RF (13.56 MHz) power of 500 W to a coil type electrode to generate plasma. A substrate side (sample stage) is also applied with an RF (13.56 MHz) power of 20 W, thus negative self bias voltage is substantially applied. Under the second etching condition using $CF_4$ and $Cl_2$, both of the W film and the TaN film are etched to the same extent. Note that it is preferable to increase etching time by about 10 to 20% in order to etch without leaving residue on the gate insulating film. By the first etching treatment, the gate insulating film which is not covered with electrodes is etched by 20 to 50 nm and ends of the first conductive layer and the second conductive layer are formed into tapered shape by an effect of a bias voltage applied to the substrate side.

Subsequently, a second etching treatment is performed with the mask of resist remaining. In the second etching treatment, $SF_6$, $Cl_2$, and $O_2$ are used as etching gases of which gas flow rate is 24/12/24 (sccm), with a pressure of 1.3 Pa, plasma is generated by applying an RF (13.56 MHz) power of 700 W to a coil type electrode, and etching is performed for about 25 seconds. A substrate side (sample stage) is also applied with an RF (13.56 MHz) power of 10 W, thus negative self bias voltage is substantially applied. In this etching condition, the W film is selectively etched to form a conductive layer in the second shape. At this time, the first conductive layer is hardly etched. By the first and second etching treatments, gate electrodes are formed of the first conductive layers 802a to 802d and the second conductive layers 803a to 803d.

Then, a first doping treatment is performed with the mask of resist remaining. Accordingly, an impurity which imparts N-type is doped to the crystalline semiconductor layer in a low concentration. The first doping treatment may be performed by ion doping or ion implantation. The ion doping may be performed with a dosage of $1\times10^{13}$ to $5\times10^{14}$ atoms/$cm^2$ and an acceleration voltage of 40 to 80 kV. In this embodiment, an acceleration voltage is 50 kV. As the impurity element which imparts N-type, an element from group 15 of Periodic Table of the Elements can be used, which is represented by phosphorus (P) or arsenic (As). In this embodiment, phosphorus is used. At that time, a first impurity region ($N^-$ region) to which a low concentration impurity is added is formed in a self-aligned manner using the first conductive layer as a mask.

Subsequently, the mask of resist is removed. Then, a new mask of resist is formed to perform a second doping treatment at a higher acceleration voltage than that of the first doping treatment. In the second doping treatment also, an impurity which imparts N-type is doped. The ion doping may be performed with a dosage of $1\times10^{13}$ to $3\times10^{15}$ atoms/$cm^2$ and an acceleration voltage of 60 to 120 kV. In this embodiment, the dosage is $3.0\times10^{15}$ atoms/$cm^2$ and the acceleration voltage is 65 kV. The second doping treatment is performed so that the impurity element is doped to a semiconductor layer under the first conductive layer by using the second conductive layer as a mask against the impurity element.

By performing the second doping, a second impurity region (N-region) is formed in a portion which is overlapped with the first conductive layer of the crystalline semiconductor layer but is not overlapped with the second conductive layer or is not covered with the mask. The second impurity region is doped with an impurity which imparts N-type in a concentration range from $1\times10^{18}$ to $5\times10^{19}$ atoms/$cm^3$. Moreover, an impurity which imparts N-type is added at a high concentration in the range from $1\times10^{19}$ to $5\times10^{21}$ atom/$cm^3$ to the portion of the crystalline semiconductor layer which is not covered with the first conductive layer or the mask and is exposed (a third impurity region: $N^+$ region). Moreover, the semiconductor layer has an $N^+$ region which is partially covered only with the mask. The concentration of the impurity which imparts N-type of this portion is the same as that of the first doping treatment. Therefore, it is referred to as the first impurity region ($N^-$ region) continuously.

Each impurity region is formed by two doping treatments in this embodiment, however, the invention is not limited to this. One or a plurality of times of doping may be performed with appropriately set conditions in order to form an impurity region having a desired impurity concentration.

Subsequently, after removing the mask of resist, a new mask of resist is formed to perform a third doping treatment. By the third doping treatment, a fourth impurity region ($P^+$ region) and a fifth impurity region ($P^-$ region) in which impurity elements which impart opposite conductivity type to the first and second conductivity types are added to a semiconductor layer which corresponds to a P-channel type TFT.

In the third doping treatment, the fourth impurity region ($P^+$ region) is formed on a portion which is not covered with the mask of resist and is not overlapped with the first conductive layer and the fifth impurity region ($P^-$ region) is formed on the portion which is not covered with the mask of resist, is overlapped with the first conductive layer, and is not overlapped with the second conductive layer. Elements from group 13 of the Periodic Table of the Elements such as boron (B), aluminum (Al), and gallium (Ga) are known as the impurity element which imparts P-type.

In this embodiment, the fourth and fifth impurity regions are formed by using boron (B) as the impurity element which imparts P-type by ion doping using diborane ($B_2H_6$). The ion doping is performed with a dosage of $1\times10^{16}$ atoms/$cm^2$ and an acceleration voltage of 80 kV.

Note that a portion which forms the N-channel type TFT is covered with the mask of resist in the third doping treatment.

Here, the fourth impurity region ($P^+$ region) and the fifth impurity region ($P^-$ region) are doped with phosphorus at different concentrations in the first and second doping treatments. However, the third doping treatment is performed so that the fourth impurity region ($P^+$ region) and the fifth impurity region ($P^-$ region) are both doped with the impurity element which imparts P-type at a concentration of $1\times10^{19}$ to $5\times10^{21}$ atoms/$cm^2$. Therefore, the fourth impurity region ($P^+$ region) and the fifth impurity region ($P^-$ region) function without problems as a source region and a drain region of a P-channel type TFT.

In this embodiment, the fourth impurity region ($P^+$ region) and the fifth impurity region ($P^-$ region) are formed by once of the third doping treatment, however, the fourth impurity region ($P^+$ region) and the fifth impurity region ($P^-$ region)

may be formed by a plurality of doping treatments appropriately according to the condition of the doping treatment.

Figure 8B:
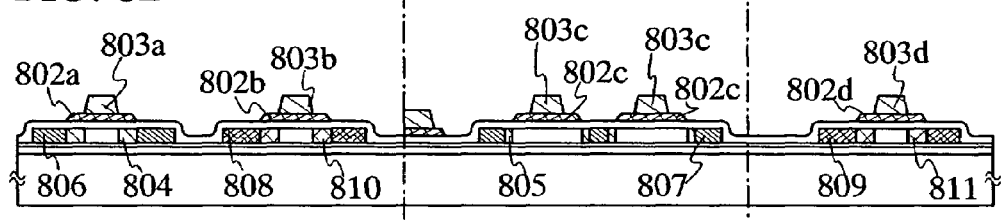

Through these doping treatments, a first impurity region (N⁻ region) 804, a second impurity region (N⁻ region) 805, a third impurity regions (N⁺ regions) 806 and 807, fourth impurity regions (P⁺ regions) 808 and 809, and fifth impurity regions (P⁻ regions) 810 and 811 are formed (FIG. 8B).

Subsequently, the mask of resist is removed to form a first passivation film 812. An insulating film containing silicon is formed in thickness of 100 to 200 nm as the first passivation film. Plasma CVD or sputtering may be used for the deposition thereof.

In this embodiment, a silicon oxide film containing nitrogen is formed in thickness of 100 nm by plasma CVD. In the case of using silicon oxide film containing nitrogen, a silicon oxynitride film formed of $SiH_4$, $N_2O$, and $NH_3$, a silicon oxynitride film formed of $SiH_4$ and $N_2O$, or a silicon oxynitride film formed of the gas that diluted $SiH_4$ and $N_2O$ with Ar may be formed by plasma CVD. A hydrogenated silicon oxynitride film formed of $SiH_4$, $N_2O$, and $H_2$ may be applied as the first passivation film. It is needless to say that the first passivation film 812 is not limited to a single layer of silicon oxynitride film as described in this embodiment, but a single layer or a laminated structure of other insulating films containing silicon may be used as well.

Figure 8C:
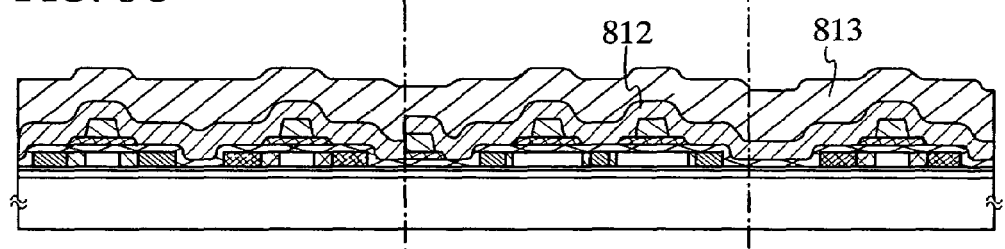

Subsequently, an interlayer insulating film 813 is formed on the first passivation film 812 (FIG. 8C). An inorganic insulating film or an organic insulating film can be used as the interlayer insulating film. As an inorganic insulating film, a silicon oxide film formed by CVD, a silicon oxide film formed by SOG (Spin On Glass) and the like can be used. As an organic insulating film, polyimide, polyamide, BCB (benzocyclobutene), acryl or positive photosensitive organic resin, negative photosensitive organic resin, a material comprising a binding of silicon and oxygen in its backbone structure and containing at least hydrogen as substituent or at least one of fluoride, alkyl group and aromatic hydrocarbon as substituent, that is a siloxane film can be used. Also, a lamination of the aforementioned films may be used.

In this embodiment, an interlayer insulating film 813 is formed of siloxane. The interlayer insulating film is formed by applying siloxane polymer on the entire surface, drying by thermal treatment at a temperature of 50 to 200° C. for 10 minutes, and further performing baking treatment at a temperature of 300 to 450° C. for 1 to 12 hours. By this baking treatment, a siloxane film is formed on the entire surface in thickness of 1 μm. By this step, a semiconductor layer can be hydrogenated or the impurity element can be activated by hydrogen in the first passivation film 812 as well as performing the baking of siloxane polymer. Thus the number of steps can be reduced and the whole process can be simplified. The hydrogenation is performed in order to saturate dangling bonds by hydrogen contained in the first passivation film.

In the case of forming an interlayer insulating film with a material other than siloxane, a thermal treatment is required for hydrogenation and activation. In that case, a step for performing a thermal treatment (a heat treatment) is required before forming the interlayer insulating film. The thermal treatment may be performed in a nitrogen atmosphere containing oxygen at a concentration of 1 ppm or less, more preferably 0.1 ppm or less, and at the temperature of 400 to 700° C. In this embodiment, an activation treatment is performed by the thermal treatment at a temperature of 410° C. for 1 hour. Note that laser annealing or rapid thermal annealing (RTA) can be applied as well as the thermal treatment.

Further, a thermal treatment may be performed before forming the first passivation film 812. However, in the case where materials for forming the first conductive layers 802a to 802d and the second conductive layers 803a to 803d are sensitive to heat, it is preferable to perform a thermal treatment after forming the first passivation film 812 in order to protect the wirings and the like as described in this embodiment. Moreover, in this case, hydrogenation by utilizing hydrogen contained in the passivation film cannot be performed since the first passivation film is not provided. In that case, hydrogenation by using hydrogen excited by plasma (plasma hydrogenation), or hydrogenation by thermal treatment in an atmosphere containing 3 to 100% of hydrogen at a temperature of 300 to 450° C. for 1 to 12 hours may be employed.

After that, a silicon nitride oxide film or a silicon oxynitride film may be formed by CVD so as to cover the interlayer insulating film 813. This film acts as an etching stopper when etching a conductive film which is formed later, which can prevent overetching of the interlayer insulating film. A silicon nitride film may be formed by sputtering thereover. This silicon nitride film can suppress the movement of alkali metal ion, therefore, it can be suppressed that a metal ion such as a lithium ion, and a natrium ion from a pixel electrode which is formed later moves to the semiconductor layer.

Subsequently, the interlayer insulating film is patterned and etched to form contact holes to reach the crystalline semiconductor layers 801a to 801d. The contact holes are formed by etching the siloxane film by using mixture gas of $CF_4$, $O_2$, and He, and etching and removing the silicon oxide film as a gate insulating film by $CHF_3$ gas.

At this time, a native oxide film (not shown) is formed in some cases on the surfaces of the crystalline semiconductor layers 801a to 801d which are exposed by opening the contact holes. Such a native oxide film is preferably removed before forming the wirings since such a native oxide film may cause to rise the resistance between the wiring and crystalline semiconductor layer, which could increase the driving voltage or make the operation impossible.

Figure 8D:
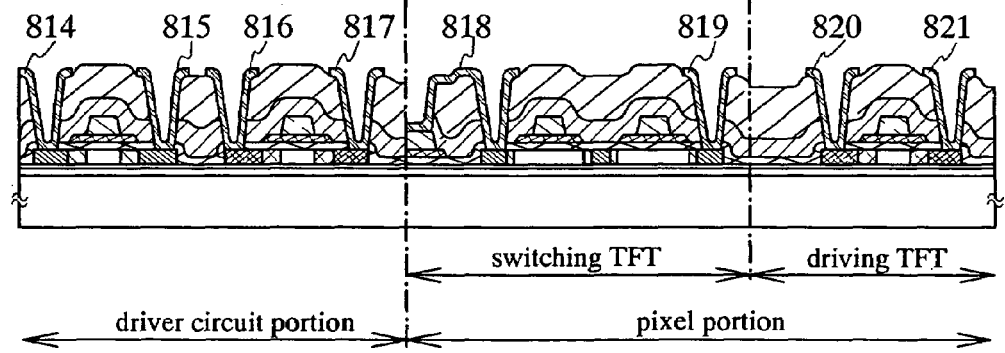

Subsequently, a source electrode and a drain electrode are formed by laminating and patterning a metal film in the contact holes. In this embodiment, a titanium-aluminum alloy film in thickness of 350 nm and a titanium film in thickness of 100 nm are laminated on a titanium film containing nitrogen atom in thickness of 100 nm respectively. Then, source electrodes and/or drain electrodes 814 to 821 which are formed of three layers are formed by patterning and etching in desired shapes (FIG. 8D).

The titanium film containing nitrogen atom as a first layer is formed by sputtering with titanium as a target and with 1:1 of flow rate of nitride and argon. With the aforementioned titanium film containing nitrogen atom on a siloxane interlayer insulating film, a film is not peeled easily, and a wiring having a low resistance connection with a crystalline semiconductor layer can be provided.

Heretofore described is the fabrication of a semiconductor element such as a thin film transistor, and a capacitor. In this embodiment, a top gate type thin film transistor using a crystalline semiconductor layer using an element which promotes crystallization is used, however, a bottom gate type thin film transistor using an amorphous semiconductor film can be used in a pixel portion as well. An amorphous semiconductor can be formed by using silicon germanium as well as silicon. In the case of using silicon germanium, it is preferable that the concentration thereof is about 0.01 to 4.5 atomic %.

Moreover, a micro crystalline semiconductor film in which crystal grain of 0.5 to 20 nm is allowed to be observed may be used in the amorphous semiconductor. Moreover, a micro crystal (μc) is a crystal of which crystal grain is 0.5 to 20 nm.

Semi-amorphous silicon (also notated as SAS) which is a semi-amorphous semiconductor can be obtained by decomposing silicon gas by glow discharge. The silicon gas is typically $SiH_4$, as well as $Si_2H_6$, $SiH_2Cl_2$, $SiHCl_3$, $SiCl_4$, $SiF_4$ and the like. By diluting the silicon gas with hydrogen, or hydrogen and one or a plurality of noble gas elements such as helium, argon, krypton, and neon, SAS can be formed easily. The silicon gas is preferably diluted with the dilution ratio of 10 to 1000 times. The reaction production of a film by the glow discharge decomposition may be performed at a pressure of 0.1 to 133 Pa. The glow discharge may be formed with a power of 1 to 120 MHz, more preferably with an RF power of 13 to 60 MHz. It is preferable that a temperature for heating the substrate is 300° C. or less, more preferably 100 to 250° C.

In the SAS formed in this manner, Raman spectrum is shifted to a lower frequency side than 520 $cm^{-1}$, and diffraction peaks of (111) and (220) are measured by X-ray diffraction, which are caused by Si crystal grating. Also, hydrogen or halogen of at least 1 atom % or more is contained as a neutralizing agent of a dangling bond. It is preferable that impurities of atmospheric components such as oxygen, nitrogen, and carbon as impurity elements in the film is $1 \times 10^{20}$ $cm^{-1}$ or less. In particular, oxygen concentration is preferably $5 \times 10^{19}$/$cm^3$ or less and more preferably $1 \times 10^{19}$/$cm^3$ or less. That means, $\mu = 1$ to 10 $cm^2$/Vsec is satisfied when formed into a TFT.

In the processes so far, wirings are formed at the same time as forming source electrodes and drain electrodes of thin film transistors. According to the invention, however, it is not required to form a lead wiring for connecting to the anode lines or the cathode lines around the substrate in parallel to those lines. Instead, in the case of employing the structure of forming external connecting portions at both ends of the anode lines or the cathode lines as shown in Embodiment Mode 1, the external connecting portions are formed at the positions as shown in FIGS. 1A to 1C and 2A and 2B at the same time as the processes so far, and both ends of the anode lines or the cathode lines are connected to the closer external connecting portion. In the case of employing a structure of using a sealing can as described in Embodiment Mode 2, an end portion which is connected to the sealing can is not connected to other wirings.

Next, a light emitting device is formed by using these semiconductor elements.

A light emitting device described in this embodiment has elements arranged in matrix each of which sandwiches a layer containing a substance which emits light between a pair of electrodes and emits light by flowing current between the electrodes. A light emission mechanism of a light emitting element is such that by applying a voltage to the pair of electrodes sandwiching the organic compound layer, electrons injected from a cathode and holes injected from an anode are recombined in a luminescent center of the organic compound layer to form molecular exciton, thereby an energy is discharged to emit light when the molecular exciton returns to a ground state.

Known as excitation states are singlet excitation and triplet excitation, and it is considered that light emission is possible by either one of these excitation states. Therefore, an element of singlet excitation state and an element of triplet excitation state may be mixed in one light emitting device according to the characteristics of the elements. For the three colors of RGB, for example, an element of triplet excitation state for red color and elements of singlet excitation state for blue and green colors may be used. Moreover, an element of triplet excitation state generally has an excellent light emitting efficiency, therefore, a driving voltage can be decreased as well.

As a material for a light emitting element, a low molecular weight light emitting material, a high molecular weight light emitting material, and a medium molecular weight light emitting material having a characteristic between the low and high molecular weight light emitting materials are included. In this embodiment, a low molecular weight light emitting material is used as an electroluminescent layer formed by vapor deposition. A high molecular weight material can be applied by spin coating and ink-jetting by dissolving in a solvent. Further, a composite material with an inorganic material as well as an organic material can be used as well.

A first electrode 901 of a light emitting element is formed so as to partially overlap a drain electrode of a thin film transistor formed in the preceding step. The first electrode is to be used as an anode or a cathode of the light emitting element. In the case of using as the anode, a metal, an alloy, a conductive compound each having a high work function, or a composite of these materials and the like are preferably used. The work function of 4.0 eV or more is a rough standard. Specifically, ITO (indium tin oxide), IZO (indium zinc oxide) obtained by mixing 2 to 20% of zinc oxide (ZnO) with indium oxide, ITSO obtained by mixing 2 to 20% of silicon oxide ($SiO_2$) with indium oxide, gold (Au), platinum (Pt), nickel (Ni), tungsten (W), chromium (Cr), molybdenum (Mo), iron (Fe), cobalt (Co), copper (Cu), palladium (Pd), a nitride of a metal material (TiN) and the like can be used.

In the case of using as the cathode, a metal, an alloy, a conductive compound each having a low work function, or a composite of these materials and the like (work function of 3.8 eV or less is a rough standard) are preferably used. Specifically, an element from group 1 or 2 of Periodic Table of the Elements, that is an alkali metal such as Li and Cs, an alkali earth metal such as Mg, Ca, and Sr, an alloy (Mg:Ag and Al:Li) and a compound (LiF, CsF, and $CaF_2$) containing these elements, as well as a transition metal containing a rare earth metal can be used. However, the second electrode transmits light in this embodiment, therefore, it can be formed by laminating ITO, IZO, ITSO and other metals (including alloy) with the aforementioned metals or an alloy containing the aforementioned metals extremely thin.

In this embodiment, the first electrode 901 is used as the anode and ITSO is employed. In the case of using ITSO as an electrode, a vacuum baking can enhance the reliability of the light emitting device.

Further, in this embodiment, the first electrode is formed after forming a source electrode and a drain electrode of a thin film transistor, however, the first electrode may be formed before the electrodes of the thin film transistor are formed.

Figure 9A:
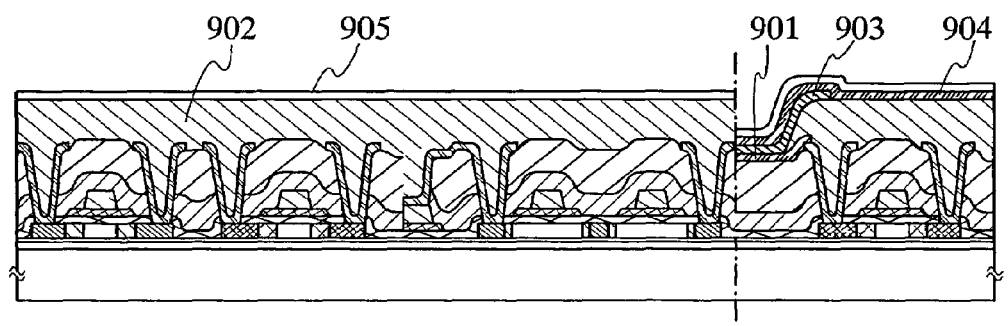
FIGS. 9A and 9B are diagrams showing processes of Embodiment 1.
Figure 9B:
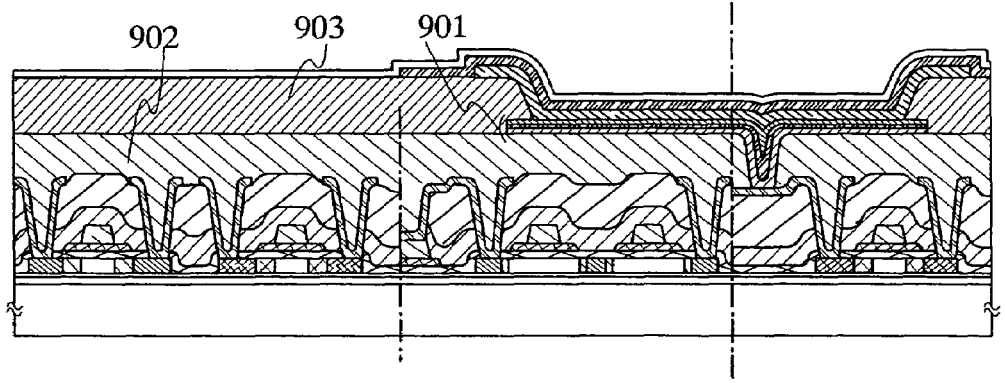

As shown in FIGS. 9A and 9B, an insulating film 902 is formed so as to cover an end of the first electrode 901 which is a pixel electrode connected to a thin film transistor in a pixel portion. The insulating film 902 is what is called a bank or a barrier. The insulating film 902 can be formed by using an inorganic insulating film and an organic insulating film. As an inorganic insulating film, a silicon oxide film formed by CVD, a silicon oxide film applied by SOG (Spin On Glass) and the like can be used, while as an organic insulating film, photosensitive or non-photosensitive polyimide, polyamide, BCB (benzocyclobutene), acryl or positive type photosensitive organic resin, negative type photosensitive organic resin, a material having a backbone structure of binding of silicon and oxygen and containing at least hydrogen as a substituent, or a material containing at least one of fluoride, alkyl group, or aromatic carbon hydride as a substituent, that is a siloxane film can be used. Further, a laminated structure of the aforementioned films can be used as well. By using a photosensitive organic material, a curvature radius of a shape of an opening portion has a shape that continuously changes, thus an electroluminescent layer can be deposited without break and the like. In this embodiment, photosensitive polyimide is used.

Subsequently, deposition is performed while moving an evaporation source by using a deposition apparatus. For example, deposition is performed in a deposition chamber which is vacuum evacuated to $5 \times 10^{-3}$ Torr (0.665 Pa) or less, more preferably to $10^{-4}$ to $10^{-6}$ Torr. In deposition, an organic compound is evaporated in advance by resistance heat and scatters in the direction of a substrate when a shutter opens in deposition. The evaporated organic compound scatters upward and deposited to the substrate through opening portions provided in a metal mask, thus an electroluminescent layer 903 (from the first electrode side, a hole injection layer, a hole transporting layer, a light emitting layer, an electron transporting layer, and an electron injection layer) is formed. Note that the electroluminescent layer 903 does not have to have such a laminated structure, but a single layer or a mixed layer may be employed as well.

After forming the electroluminescent layer 903, a second electrode 904 is formed in contact with the electroluminescent layer 903. In this embodiment, the first electrode 901 is an anode, therefore, the second electrode 904 is formed as a cathode. The cathode may be formed by using the materials described above. In this embodiment, the second electrode (cathode) 904 which transmits light is formed by forming ITSO by sputtering after forming a thin film containing Li.

In this embodiment, the first electrode 901 and the second electrode 904 are both formed of materials which transmit light, therefore, light can be extracted from both the top and bottom surfaces of the substrate. It is needless to say that by controlling transmittance of one of the electrodes and according to a material used closer to the substrate side than the electroluminescent layer, light can be extracted from only the top surface or the bottom surface as well.

FIG. 9B is an example of a top emission structure, in which the pixel electrode 901 and an electrode of a thin film transistor are formed in different layers. A first interlayer insulating film 813 and a second interlayer insulating film 903 can be formed by using a similar material to the interlayer insulating film 813 in FIGS. 8A to 8D and its combination can be made freely, however, both layers are formed of siloxane here. The pixel electrode 901 is formed by laminating ITSO, TiN and Al—Si in this order from the second interlayer insulating film 903 side, however, it may be a single layer or a laminated structure of two layers or four or more layers as well.

On the other hand, in the case of forming the second electrode 904 by sputtering, a surface of the electron injection layer or an interface between the electron injection layer and the electron transporting layer may be damaged by sputtering, which may adversely affect the characteristics. In order to prevent this, a material which is not easily damaged by sputtering is provided at the closest position to the second electrode 904. Such a material which is not easily damaged by sputtering and can be used for the electroluminescent layer 903 includes MoOx. However, MoOx is a preferable substance to be used as a hole injection layer, therefore, the second electrode 904 is required to be an anode when providing MoOx in contact with the second electrode 904.

In this case, the first electrode 901 is formed as the cathode, and after that, the electron injection layer, the electron transporting layer, the light emitting layer, the hole transporting layer, the hold injection layer (MoOx), and the second electrode (anode) are required to be formed in this order. Moreover, the driving thin film transistor of a pixel is required to be N-channel type. MoOx is formed by vapor deposition and the one which satisfies x=3 or more can be preferably used. In this case, a thin film transistor in a pixel portion is preferably formed by using a transistor having a semiconductor layer of a-Si:H that is originally N-channel type, since the process can be simplified. In the case where a driver circuit portion is formed on the same substrate, it is preferable that only the driver circuit portion is crystallized by irradiating laser and the like.

After that, a silicon oxide film containing nitrogen is formed as a second passivation film 905 by plasma CVD. In the case of using a silicon oxide film containing nitride, a silicon oxynitride film formed of $SiH_4$, $N_2O$, and $NH_3$ by plasma CVD, a silicon oxynitride film formed of $SiH_4$ and $N_2O$, or a silicon oxynitride film formed of the gas that diluted $SiH_4$ and $N_2O$ with Ar is preferably formed. Further, a silicon oxynitride hydrogenated film formed of $SiH_4$, $N_2O$, and $H_2$ may be used as the first passivation film. It is needless to say that the second passivation film 905 is not limited to have a single layer structure, but a single layer or a laminated structure of other insulating films containing silicon may be used as well. Moreover, a silicon nitride film or a diamond-like carbon film may be formed instead of the silicon oxide film containing nitride.

Subsequently, a display portion is sealed in order to protect the electroluminescent element from a substance that promotes deterioration such as moisture. In the case of using a counter substrate for sealing, it is sealed with an insulating sealant so that external connecting portions are exposed. The space between the counter substrate and an element substrate may be filled with an inert gas such as dry nitrogen or a sealant may be applied over the whole surface of the pixel portion, thereby forming the counter substrate. It is preferable to use ultraviolet curing resin and the like for the sealant. The sealant may be mixed with a drying agent or particles for maintaining a gap between the substrates uniform.

Subsequently, by attaching a flexible wiring substrate to the external connecting portion, panels shown in FIGS. 1A to 1C and 2A to 2C are completed. By providing external connecting portions at two opposite ends of the panel (close to the ends of the anode lines or the cathode lines) to supply a voltage from the closer external connecting portion, a large voltage drop does not occur and a high quality display can be obtained even when a display portion area is increased as compared to the conventional one.

In the case of using a sealing can for sealing, the insulating film 902 is removed around the ends of the anode lines or the cathode lines, or opening portions for reaching the anode lines or the cathode lines are formed. Then, by adhering the sealing can by the method as described in Embodiment Mode 2, the sealing can and the anode lines or the cathode lines become conductive as well as the electroluminescent element is sealed. The sealing can may be supplied with a voltage through a flexible wiring substrate or directly connected to a power source circuit. It is advantageous that the number of required pins of the flexible wiring substrate can be reduced in the case of supplying a voltage directly from the power source circuit.

After that, an insulating film is formed so as to cover the sealing can in order to prevent a short-circuit with other portions. The insulating film can be formed easily by an application method although any other methods may be employed. In this manner, a sealing can with a large sectional area is used as a wiring to supply a voltage, therefore, a voltage drop is less likely to occur. Further, since a voltage is not supplied to the anode lines or the cathode lines from the external connecting portions, the number of pins can be reduced, which makes a layout easier or allows other useful data to be supplied to the panel. Accordingly, a high quality display with a narrow frame area can be fabricated.

EMBODIMENT 2

Electronic apparatuses to which the invention is applied include a video camera, a digital camera, a goggle type display (head mounted display), a navigation system, an audio reproducing apparatus (a car audio, an audio component system and the like), a portable information terminal (a mobile computer, a portable phone, a portable game machine, an electronic book or the like) and the like. Specific examples of these electronic apparatuses are shown in FIGS. 10A to 10D.

Figure 10A:
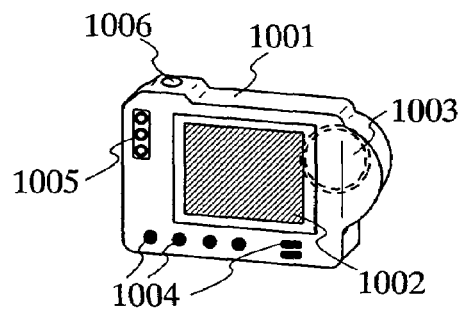
FIGS. 10A to 10D are views of electronic apparatuses using the invention.

FIG. 10A illustrates a digital still camera including a main body 1001, a display portion 1002, an image receiving portion 1003, operating keys 1004, an external connecting port 1005, a shutter 1006 and the like. The invention can be applied to the display portion 1002. By realizing a narrow frame, the display portion 1002 can be formed larger than the conventional one, with the same volume required when mounting the display portion. Thus a display that can be seen easily can be obtained. Moreover, compactness can be realized as well as a display unevenness due to a voltage drop is reduced.

Figure 10B:
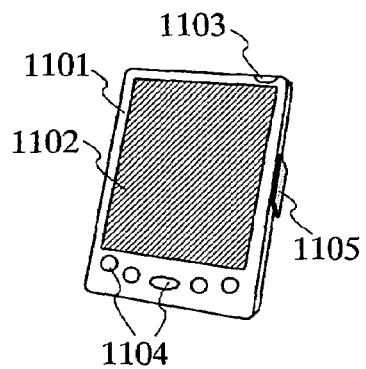

FIG. 10B illustrates a mobile computer including a main body 1101, a display portion 1102, a switch 1103, operating keys 1104, an infrared port 1105 and the like. The invention can be applied to the display portion 1102. By realizing a narrow frame with the same display portion area, an extra space of the frame portion can be reduced, which makes a portable use more convenient. Moreover, display unevenness due to a voltage drop is reduced.

Figure 10C:
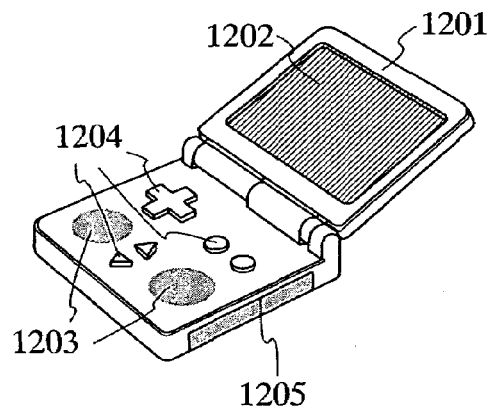

FIG. 10C illustrates a portable game machine including a housing 1201, a display portion 1202, speaker portions 1203, operating keys 1204, a recording medium inserting portion 1205 and the like. The invention can be applied to the display portion 1202. By realizing a narrow frame with the same display portion area, an extra space of the frame portion can be reduced, which makes a portable use more convenient. Moreover, display unevenness due to a voltage drop is reduced.

Figure 10D:
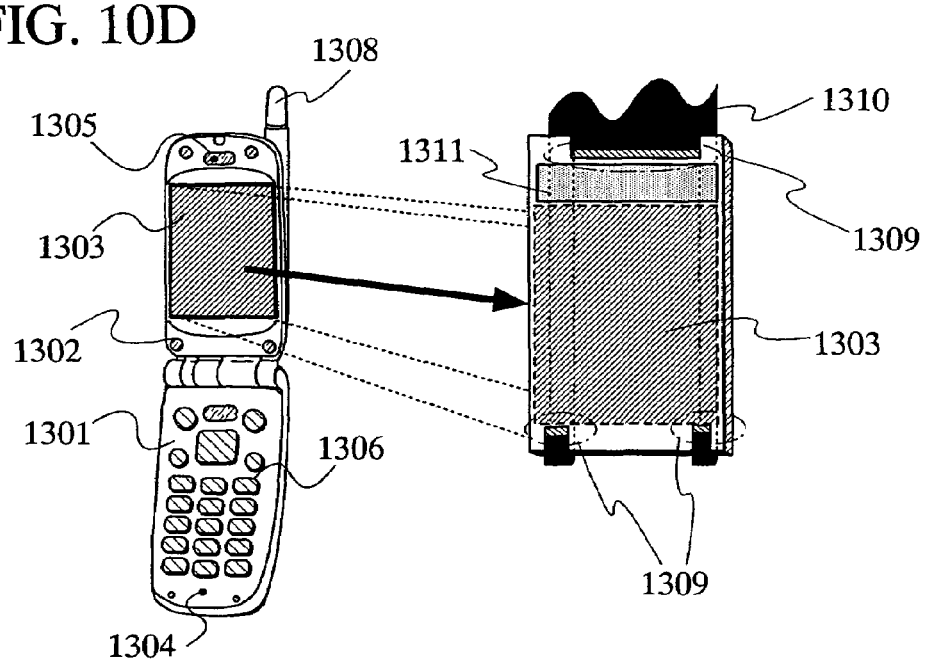

FIG. 10D illustrates a portable phone including a main body 1301, a housing 1302, a display portion 1303, an audio input portion 1304, an audio output portion 1305, an operating key 1306, an antenna 1308 and the like. The light emitting apparatus of the invention is used for the display portion 1303 to complete the portable phone. The ends of the anode lines or the cathode lines in the display portion 1303 are connected to a closer external connecting portion 1309. A narrow frame is realized without concerning about a voltage drop since a voltage is supplied from a flexible wiring substrate 1310. By realizing a narrow frame, the display portion can be larger than the conventional one with the same volume required when mounting the display portion, thus a display that can be seen easily can be obtained. Moreover, compactness can be realized as well as display unevenness due to a voltage drop is reduced.

This application is based on Japanese Patent Application serial no. 2003-391815 filed in Japan Patent Office on Nov. 21, 2003, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A display device comprising:
a pixel portion over a substrate;
a plurality of anode lines or cathode lines formed in stripe shape in the pixel portion; and
a plurality of external connecting portions with the pixel portion sandwiched therebetween,
wherein the external connecting portions are provided on both ends of the anode lines or the cathode lines;
wherein both ends of the anode lines or the cathode lines are connected to the closer external connecting portions,
wherein a flexible wiring substrate is electrically connected to the external connecting portions, and
wherein the pixel portion has a first portion which overlaps with the flexible wiring substrate and a second portion which does not overlap with the flexible wiring substrate.

2. The display device according to claim 1,
wherein both ends of the anode lines or the cathode lines are supplied with a voltage through the conductors conductive film.

3. The display device according to claim 1,
wherein the display device is one selected from the group consisting of a camera, a goggle type display, a navigation system, an audio reproducing apparatus and a portable information terminal.

4. A display device comprising:
a pixel portion over a substrate;
a plurality of anode lines or cathode lines formed in stripe shape in the pixel portion;
a first wiring connected to one ends of all the anode lines or the cathode lines;
a second wiring connected to the other ends of all the anode lines or the cathode lines; and
a plurality of external connecting portions with the pixel portion sandwiched therebetween,
wherein the external connecting portions are provided on both ends of the anode lines or the cathode lines;
wherein the first wiring and the second wiring are connected to the closer external connecting portions,
wherein a flexible wiring substrate is electrically connected to the external connecting portions, and
wherein the pixel portion has a first portion which overlaps with the flexible wiring substrate and a second portion which does not overlap with the flexible wiring substrate.

5. The display device according to claim 4,
wherein both ends of the anode lines or the cathode lines are supplied with a voltage through the flexible wiring substrate.

6. The display device according to claim 4,
wherein the display device is one selected from the group consisting of a camera, a goggle type display, a navigation system, an audio reproducing apparatus and a portable information terminal.

7. A display device comprising:
a pixel portion;
a light emitting element comprising an anode, a cathode, and a light emitting layer between the anode and the cathode in the pixel portion;
a plurality of anode lines or cathode lines formed in stripe shape in the pixel portion;
a conductive sealing can for sealing the pixel portion;
a flexible wiring substrate electrically connected to the conductive sealing can; and a drying agent between the light emitting element and the conductive sealing can, wherein the anode lines or the cathode lines are electrically connected to the conductive sealing can.

8. The display device according to claim 7, wherein the display device is one selected from the group consisting of a camera, a goggle type display, a navigation system, an audio reproducing apparatus and a portable information terminal.

9. A display device comprising:

a pixel portion;

a light emitting element comprising an anode, a cathode, and a light emitting layer between the anode and the cathode in the pixel portion;

a plurality of anode lines or cathode lines formed in stripe shape in the pixel portion;

a conductive sealing can for sealing the pixel portion;

a flexible wiring substrate electrically connected to the conductive sealing can; and a drying agent between the light emitting element and the conductive sealing can, wherein both ends of the anode lines or the cathode lines are electrically connected to the conductive sealing can.

10. The display device according to claim 9, wherein the display device is one selected from the group consisting of a camera, a goggle type display, a navigation system, an audio reproducing apparatus and a portable information terminal.

11. A display device comprising:

a pixel portion;

a light emitting element comprising an anode, a cathode, and a light emitting layer between the anode and the cathode in the pixel portion;

a plurality of anode lines or cathode lines formed in stripe shape in the pixel portion;

a first wiring connected to one ends of all the anode lines or the cathode lines;

a second wiring connected to the other ends of all the anode lines or the cathode lines;

a conductive sealing can for sealing the pixel portion;

a drying agent between the light emitting element and the conductive sealing can, and a flexible wiring substrate electrically connected to the conductive sealing can, wherein the first wiring is electrically connected to the conductive sealing can.

12. The display device according to claim 11, wherein the display device is one selected from the group consisting of a camera, a goggle type display, a navigation system, an audio reproducing apparatus and a portable information terminal.

13. A display device comprising:

a pixel portion;

a light emitting element comprising an anode, a cathode, and a light emitting layer between the anode and the cathode in the pixel portion;

a plurality of anode lines or cathode lines formed in stripe shape in the pixel portion;

a first wiring connected to one ends of all the anode lines or the cathode lines;

a second wiring connected to the other ends of all the anode lines or the cathode lines;

a conductive sealing can for sealing the pixel portion;

a drying agent between the light emitting element and the conductive sealing can, and a flexible wiring substrate electrically connected to the conductive sealing can, wherein the first wiring and the second wiring are electrically connected to the conductive sealing can.

14. The display device according to claim 13, wherein the display device is one selected from the group consisting of a camera, a goggle type display, a navigation system, an audio reproducing apparatus and a portable information terminal.

15. A display device comprising:

a pixel portion comprising a light emitting element and a transistor, wherein the light emitting element comprises an anode, a cathode, and a light emitting layer between the anode and the cathode;

a plurality of anode lines or cathode lines formed in stripe shape in the pixel portion, wherein one of the anode lines is electrically connected to the anode or one of the cathode lines is electrically connected to the cathode; and a conductive film on and in contact with a counter substrate, wherein the anode lines or the cathode lines are electrically connected to the conductive film, wherein the conductive film is located between the counter substrate and the pixel portion, wherein the anode or the cathode is electrically connected to the conductive film through the transistor.

16. The display device according to claim 15, wherein the display device is one selected from the group consisting of a camera, a goggle type display, a navigation system, an audio reproducing apparatus and a portable information terminal.

17. A display device comprising:

a pixel portion comprising a light emitting element and a transistor, wherein the light emitting element comprises an anode, a cathode, and a light emitting layer between the anode and the cathode;

a plurality of anode lines or cathode lines formed in stripe shape in the pixel portion, wherein one of the anode lines is electrically connected to the anode or one of the cathode lines is electrically connected to the cathode;

a conductive film on and in contact with a counter substrate, wherein both ends of the anode lines or the cathode lines are electrically connected to the conductive film, and wherein the conductive film is located between the counter substrate and the pixel portion, wherein the anode or the cathode is electrically connected to the conductive film through the transistor.

18. The display device according to claim 17, wherein the display device is one selected from the group consisting of a camera, a goggle type display, a navigation system, an audio reproducing apparatus and a portable information terminal.

19. A display device comprising:

a pixel portion over a substrate, the pixel portion comprising a light emitting element and a transistor, wherein the light emitting element comprises an anode, a cathode, and a light emitting layer between the anode and the cathode;

a plurality of anode lines or cathode lines formed in stripe shape in the pixel portion wherein one of the anode lines is electrically connected to the anode or one of the cathode lines is electrically connected to the cathode;

a first wiring connected to one ends of all the anode lines or the cathode lines;

a second wiring connected to the other ends of all the anode lines or the cathode lines; and a conductive film on and in contact with a counter substrate, wherein the first wiring is electrically connected to the conductive film, wherein the conductive film is located between the counter substrate and the pixel portion, wherein the anode or the cathode is electrically connected to the conductive film through the transistor.

20. The display device according to claim 19, wherein the display device is one selected from the group consisting of a camera, a goggle type display, a navigation system, an audio reproducing apparatus and a portable information terminal.

21. A display device comprising:
a pixel portion over a substrate, the pixel portion comprising a light emitting element and a transistor, wherein the light emitting element comprises an anode, a cathode, and a light emitting layer between the anode and the cathode;
a plurality of anode lines or cathode lines formed in stripe shape in the pixel portion wherein one of the anode lines is electrically connected to the anode or one of the cathode lines is electrically connected to the cathode;
a first wiring connected to one ends of all the anode lines or the cathode lines;
a second wiring connected to the other ends of all the anode lines or the cathode lines; and
a conductive film on and in contact with a counter substrate,
wherein the first wiring and the second wiring are electrically connected to the conductive film,
wherein the conductive film is located between the counter substrate and the pixel portion,
wherein the anode or the cathode is electrically connected to the conductive film through the transistor.

22. The display device according to claim 21, wherein the display device is one selected from the group consisting of a camera, a goggle type display, a navigation system, an audio reproducing apparatus and a portable information terminal.

23. A display device comprising:
a substrate;
a pixel portion over the substrate;
two through holes formed in the substrate with the pixel portion interposed therebetween;
a plurality of anode lines or cathode lines formed in stripe shape formed in the pixel portion; and
a conductive film formed over the substrate on an opposite surface to a surface on which a pixel portion is formed,
wherein the conductive film is electrically connected to the anode lines or cathode lines through the one of the through holes, and
wherein the conductive film is electrically connected to a FPC through the other one of the through holes.

24. The display device according to claim 23, wherein the display device is one selected from the group consisting of a camera, a goggle type display, a navigation system, an audio reproducing apparatus and a portable information terminal.

25. A display device comprising:
a substrate;
a pixel portion over the substrate;
two through holes formed in the substrate with the pixel portion interposed therebetween;
a plurality of anode lines or cathode lines formed in stripe shape formed in the pixel portion; and
a conductive film formed over the substrate on an opposite surface to a surface on which a pixel portion is formed,
wherein the conductive film is electrically connected to both ends of the anode lines or the cathode lines through the one of the through holes, and
wherein the conductive film is electrically connected to a FPC through the other one of through holes.

26. The display device according to claim 25, wherein the display device is one selected from the group consisting of a camera, a goggle type display, a navigation system, an audio reproducing apparatus and a portable information terminal.

27. A display device comprising:
a substrate;
a pixel portion over the substrate;
two through holes formed in the substrate with the pixel portion interposed therebetween;
a plurality of anode lines or cathode lines formed in stripe shape in the pixel portion;
a first wiring connected to one ends of all the anode lines or the cathode lines;
a second wiring connected to the other ends of all the anode lines or the cathode lines; and
a conductive film formed over the substrate on an opposite surface to a surface on which the pixel portion is formed,
wherein the conductive film is electrically connected to the first wiring through one of the though holes, and
wherein the conductive film is electrically connected to a FPC though the other one of the through holes.

28. The display device according to claim 27, wherein the display device is one selected from the group consisting of a camera, a goggle type display, a navigation system, an audio reproducing apparatus and a portable information terminal.

29. A display device comprising:
a substrate;
a pixel portion over the substrate;
two through holes formed in the substrate with the pixel portion interposed therebetween;
a plurality of anode lines or cathode lines formed in stripe shape in the pixel portion;
a first wiring connected to one ends of all the anode lines or the cathode lines;
a second wiring connected to the other ends of all the anode lines or the cathode lines; and
a conductive film formed over the substrate on an opposite surface to a surface on which the pixel portion is formed,
wherein the conductive film is electrically connected to the first wiring though one of the though holes and the second wiring through the other one of the through holes, and
wherein the conductive film is electrically connected to a FPC through the other one of the though holes.

30. The display device according to claim 29, wherein the display device is one selected from the group consisting of a camera, a goggle type display, a navigation system, an audio reproducing apparatus and a portable information terminal.

* * * * *

UNITED STATES PATENT AND TRADEMARK OFFICE
CERTIFICATE OF CORRECTION

| | | |
|---|---|---|
| PATENT NO. | : 7,576,485 B2 | Page 1 of 1 |
| APPLICATION NO. | : 10/988265 | |
| DATED | : August 18, 2009 | |
| INVENTOR(S) | : Hisashi Ohtani | |

It is certified that error appears in the above-identified patent and that said Letters Patent is hereby corrected as shown below:

On the title page,

[*] Notice:   Subject to any disclaimer, the term of this patent is extended or adjusted under 35 USC 154(b) by 491 days Delete the phrase "by 491 days" and insert -- by 632 days --

Signed and Sealed this

Twentieth Day of April, 2010

David J. Kappos
*Director of the United States Patent and Trademark Office*